(12) United States Patent
Park et al.

(10) Patent No.: US 11,676,544 B2
(45) Date of Patent: Jun. 13, 2023

(54) ORGANIC LIGHT EMITTING DIODE DISPLAY DEVICE

(71) Applicant: SAMSUNG DISPLAY CO., LTD., Yongin-si (KR)

(72) Inventors: Jun Hyun Park, Suwon-si (KR); An Su Lee, Seoul (KR); Dong Woo Kim, Yongin-si (KR); Sung Jae Moon, Seongnam-si (KR); Kang Moon Jo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/523,412

(22) Filed: Nov. 10, 2021

(65) Prior Publication Data

US 2022/0068226 A1    Mar. 3, 2022

Related U.S. Application Data

(63) Continuation of application No. 16/736,993, filed on Jan. 8, 2020, now Pat. No. 11,183,125.

(30) Foreign Application Priority Data

Jan. 9, 2019    (KR) .................. 10-2019-0002679

(51) Int. Cl.
   *G09G 3/3291* (2016.01)
   *H01L 27/32* (2006.01)
(52) U.S. Cl.
   CPC ....... *G09G 3/3291* (2013.01); *H01L 27/3276* (2013.01); *G09G 2300/0426* (2013.01)

(58) Field of Classification Search
   CPC .......... G09G 3/3291; G09G 2300/0426; H01L 27/3276
   See application file for complete search history.

(56) References Cited

U.S. PATENT DOCUMENTS

| | | | |
|---|---|---|---|
| 11,183,125 B2 * | 11/2021 | Park | H01L 51/5221 |
| 2011/0043495 A1 * | 2/2011 | Bang | H01L 27/3276 |
| | | | 345/204 |

(Continued)

FOREIGN PATENT DOCUMENTS

| | | |
|---|---|---|
| KR | 10-2011-0019498 | 2/2011 |
| KR | 10-2016-0130336 | 11/2016 |

(Continued)

*Primary Examiner* — Kenneth B Lee, Jr.
(74) *Attorney, Agent, or Firm* — F. Chau & Associates, LLC

(57) ABSTRACT

An organic light emitting diode display including: a data wiring that includes a main data line disposed in a display area and a first data line disposed in a peripheral area; a driving voltage wiring that includes a main driving voltage line disposed in the display area and a first driving voltage line that is connected with the main driving voltage line and disposed in the peripheral area while extending in a first direction; and a driving low-voltage wiring that includes a cathode extending to the peripheral area while overlapping the display area, and a plurality of first driving low-voltage connection portions that are connected with the cathode and disposed in the peripheral area, wherein each of the plurality of first driving low-voltage connection portions comprises a wiring portion extended in the first direction and a pad portion electrically connected with the wiring portion.

11 Claims, 22 Drawing Sheets

(56) References Cited

U.S. PATENT DOCUMENTS

2016/0322439 A1 11/2016 Shin
2017/0365217 A1 12/2017 An et al.
2020/0219453 A1 7/2020 Park et al.

FOREIGN PATENT DOCUMENTS

| KR | 10-2017-0057911 | 5/2017 |
| KR | 10-2018-0036855 | 4/2018 |
| KR | 10-2018-0049005 | 5/2018 |

* cited by examiner

ORGANIC LIGHT EMITTING DIODE DISPLAY DEVICE

CROSS-REFERENCE TO RELATED APPLICATIONS

This application is a continuation of U.S. patent application Ser. No. 16/736,993 filed on Jan. 8, 2020, which claims priority under 35 U.S.C. § 119 to Korean Patent Application No. 10-2019-0002679 filed in the Korean Intellectual Property Office on Jan. 9, 2019, the disclosures of which are incorporated by reference herein in their entireties.

(a) TECHNICAL FIELD

The present invention relates to an organic light emitting diode display, and more particularly, to a peripheral area that surrounds a display area of an organic light emitting diode display.

(b) DESCRIPTION OF THE RELATED ART

A display device is a device for displaying an image, and an organic light emitting diode display is one example of a display device.

Since the organic light emitting diode display has a self-emission characteristic, it does not require a separate light source. Therefore, the organic light emitting diode display can be made with reduced thickness and weight. Further, the organic light emitting diode display has high-quality characteristics such as low power consumption, high luminance, and high response speed.

The organic light emitting diode display has a complicated pixel structure and a large number of wirings connected to the pixels. Therefore, the wiring structure of the peripheral area surrounding the display area is relatively complicated.

SUMMARY

An organic light emitting diode display according to an exemplary embodiment of the present invention includes: a data wiring that includes a main data line disposed in a display area and a first data line disposed in a peripheral area; a driving voltage wiring that includes a main driving voltage line disposed in the display area and a first driving voltage line that is connected with the main driving voltage line and disposed in the peripheral area while extending in a first direction; and a driving low-voltage wiring that includes a cathode extending to the peripheral area while overlapping the display area, and a plurality of first-driving low-voltage connection portions that are connected with the cathode and disposed in the peripheral area, wherein each of the plurality of first driving low-voltage connection portions includes a wiring portion extended in the first direction and a pad portion electrically connected with the wiring portion.

The driving low-voltage wiring may further include a second driving low-voltage connection portion that electrically connects the cathode and the first driving low-voltage connection portions.

The second driving low-voltage connection portion may include a wiring portion extended in the first direction and a connection portion electrically connected with the wiring portion.

The first driving voltage line may include a wiring portion extended in the first direction and a pad portion electrically connected with the wiring portion.

The second driving low-voltage connection portion and first driving voltage line may overlap each other in a plan view.

A width where the wiring portion of the second driving low-voltage connection portion and the wiring portion of the first driving voltage line overlap each other may be half or less than half of a width of the wiring portion of the first driving voltage line.

The wiring portion of the second driving low-voltage connection portion may overlap the pad portion of the first driving voltage line.

The first driving voltage line may extend to an area that is adjacent to the display area, and may include only a plurality of pads that are separated from each other.

The first driving voltage line and the first driving low-voltage connection portion may be disposed in different layers.

The driving voltage wiring may further include a second driving voltage line that is disposed in the display area and is electrically connected with the main driving voltage line, wherein the driving voltage wiring may have a mesh shape in the display area.

The driving low-voltage wiring may further include a first driving low-voltage line and a second driving low-voltage line that are disposed in the display area, and may have a mesh shape.

An organic light emitting diode display according to an exemplary embodiment of the present invention includes: a data wiring that includes a main data line disposed in a display area and a first data line disposed in a peripheral area; a driving voltage wiring that includes a main driving voltage line disposed in the display area, a first driving voltage line that is connected with the main driving voltage line and disposed in the peripheral area, and a plurality of driving voltage pads for receiving a driving voltage, wherein the first driving voltage line extends in the second direction; and a driving low-voltage wiring that includes a cathode extending to the peripheral area and overlapping the display area, a peripheral driving low-voltage line disposed in the peripheral area and connected with the cathode, and a plurality of driving low-voltage pads for receiving the driving voltage, wherein the driving voltage pads are formed in a layer different from the first driving voltage line, and the driving low-voltage pads are formed in a different layer from the peripheral driving low-voltage line.

The first driving voltage line and the peripheral driving low-voltage line may be formed in a data conductive layer, and the driving voltage pads and the driving low-voltage pads may be formed in a gate conductive layer.

The cathode may cover at least a part of the first driving voltage line.

The cathode does may not overlap the first driving voltage line.

The driving voltage wiring may further include a first driving voltage connection portion that electrically connects the driving voltage pads and a second driving voltage line of the driving voltage wiring.

The first driving voltage connection portion may be disposed in a metal layer.

The first driving voltage connection portion may be disposed in an anode layer.

The driving voltage wiring may further include a second driving voltage line disposed in the display area and electrically connected with the main driving voltage line, wherein the driving voltage wiring may have a mesh structure.

The driving low-voltage wiring may further include a first driving low-voltage line and a second driving low-voltage line that are disposed in the display area, and may have a mesh structure.

An organic light emitting diode display according to an exemplary embodiment of the present invention includes: a data wiring; a driving voltage wiring that includes a main driving voltage line and a first driving voltage line disposed in a peripheral area and connected with the main driving voltage line; and a driving low-voltage wiring that includes a cathode and a plurality of first driving low-voltage connection portions, wherein at least one of the first driving low-voltage connection portions is disposed in the peripheral area and includes a wiring portion and a pad portion.

DETAILED DESCRIPTION OF THE EMBODIMENTS

Figure 1:
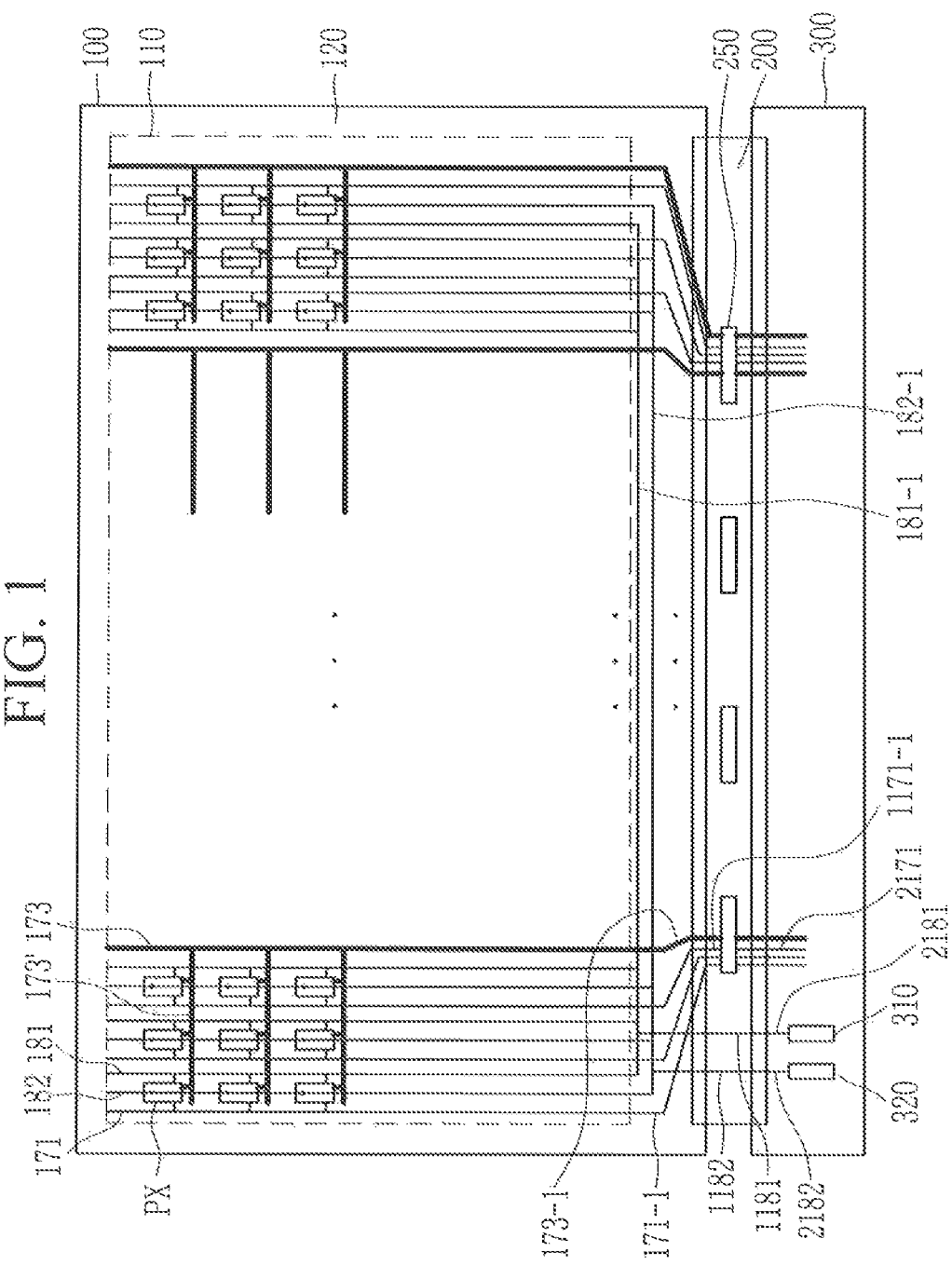
FIG. 1 is a layout view of an organic light emitting diode display according to an exemplary embodiment of the present invention.

Hereinafter, exemplary embodiments of the present invention will be described more fully with reference to the accompanying drawings. As those skilled in the art would realize, the described embodiments may be modified in various different ways, and thus, should not be limited to the embodiments set forth herein.

Like reference numerals may designate like elements throughout the specification.

In the drawings, the thickness of layers, films, panels, regions, etc., may be exaggerated for clarity.

It will be understood that when an element such as a layer, film, region, or substrate is referred to as being "on" another element, it can be directly on the other element or intervening elements may also be present.

Further, in this specification, the phrase "on a plane" may mean viewing a target portion from the top, and the phrase "on a cross-section" may mean viewing a cross-section formed by vertically cutting a target portion from the side.

Hereinafter, a structure of an organic light emitting diode (OLED) display will be described with reference to FIG. 1.

FIG. 1 is a layout view of an organic light emitting diode (OLED) display according to an exemplary embodiment of the present invention.

The OLED display according to the present exemplary embodiment includes a display panel 100 where pixels PX are formed, a printed circuit board 300 where voltage applying portions 310 and 320 are formed, and a flexible printed circuit board 200 that connects the display panel 100 and the printed circuit board 300 and where driving chips 250 are formed.

The display panel 100 includes a display area 110 where the pixels PX are formed and thus an image is displayed, and a peripheral area 120 that includes a fan-out area while surrounding the display area 110.

Data lines 171 to which a data voltage is applied, driving voltage lines 181 to which a driving voltage ELVDD is applied, and driving low-voltage lines 182 to which a driving low-voltage ELVSS is applied are connected to the pixels PX formed in the display area 110. Here, the driving low-voltage line 182 may be a cathode 410 having an integrated structure that wholly covers the display area 110. In addition, the pixel PX is connected with detection signal lines 173 and 173' to which an initialization voltage is applied and that detect a voltage of a specific node in the pixel PX when the initialization voltage is not applied.

More various lines in addition to the detection signal lines 173 and 173' may further be connected to the pixel PX. The pixel PX according to the present exemplary embodiment is illustrated in detail in FIG. 12 to FIG. 14.

In FIG. 1, the data line (hereinafter also referred to as a main data line) 171 is disposed at the left side and the driving voltage line (hereinafter also referred to as a main driving voltage line) 181 is disposed at the right side with reference to the pixel PX, and the driving low-voltage line 182 passes above the pixel PX, but this is not restrictive. In addition, the detection signal lines 173 and 173' may not be formed in every array of pixels PX. However, in FIG. 1, one vertical detection signal line 173 is formed in every plurality of pixel arrays PX and is connected with the plurality of pixels PX through a detection signal extension portion 173' extended from the vertical detection signal line 173 in a horizontal direction (e.g., a first direction). In the present exemplary embodiment, one vertical detection signal line 173 is formed in every array of pixels PX, and three pixels PX in a row of the array and the vertical detection signal line 173 are connected with each other by the detection signal line extension portion 173'. In addition, according to exemplary embodiments of the present invention, the driving voltage line 181 may not be formed in every pixel array.

In the peripheral area 120 of the display panel 100, a peripheral data line (hereinafter also referred to as a first data line) 171-1 connected with the data line 171, a peripheral detection signal line 173-1 connected with the vertical detection signal line 173, a peripheral driving voltage line (hereinafter also referred to as a first driving voltage line) 181-1 connected with the driving voltage line 181, and a peripheral driving low-voltage connection portion (hereinafter referred to as a first driving low-voltage connection portion) 182-1 connected with the driving low-voltage line 182 are formed.

The peripheral data line 171-1 and the peripheral detection signal line 173-1 are disposed at opposite sides in the fan-out area in the peripheral area 120. Such a structure enables receipt of a signal from one driving chip 250 in a predetermined area, and thus, the peripheral data line 171-1 and the peripheral detection signal line 173-1 are direct toward a center of the fan-out area while being bent. Thus, pads disposed at ends of the peripheral data lines 171-1 and peripheral detection signal lines 173-1 can be arranged near each other at the driving chips 250. In addition, the peripheral data lines 171-1 and the peripheral detection signal lines 173-1 respectively have different lengths due to the bending structure. To compensate for this length difference, each of the peripheral data lines 171-1 and each of the peripheral detection signal lines 173-1 may further include a resistor portion that enables all data lines or all detection signal lines to have the same resistance value. A first conductive layer (e.g., a data conductive layer in the present exemplary embodiment) where the data lines 171 and the detection signal lines 173 are formed in the display area 110 and a second conductive layer (e.g., a gate conductive layer in the present exemplary embodiment) where the peripheral data lines 171-1 and the peripheral detection signal lines 173-1 are formed in the peripheral area 120 may be different from each other.

The peripheral driving voltage line 181-1 extends in a horizontal direction, and has a structure that includes a connection line connecting the plurality of driving voltage lines 181. The connection line of the peripheral driving voltage line 181-1 has a structure in which the connection line is integrally formed as a whole in the peripheral area 120 such that all the driving voltage lines 181 are connected with a single connection line. However, according to exemplary embodiments of the present invention, the connection line of the peripheral driving voltage line 181-1 may be provided in plural and one connection line may be connected with only some of the driving voltage lines 181.

In addition, the peripheral driving low-voltage connection portion 182-1 is provided in plural and the peripheral driving low-voltage connection portions 182-1 are separated from one another. In FIG. 1, the peripheral driving low-voltage connection portion 182-1 is illustrated as a single wiring extending in a horizontal direction, but the respective peripheral driving low-voltage connection portions 182-1 that are separated from each other are connected by the cathode 410, and thus, they are shown to be connected when viewed in a circuit structure (referring to FIG. 2). In other words, respectively separated peripheral driving low-voltage connection portions 182-1 may be connected with the driving low-voltage lines 182, which are cathodes 410 that cover the display area 110. The cathode 410 not only covers the entire display area 110 but is also formed in a part of the peripheral area 120, and thus, may be connected with the peripheral driving low-voltage connection portion 182-1 in the peripheral area 120. A driving low-voltage ELVSS applied to the peripheral driving low-voltage connection portions 182-1 is transmitted to the cathode 410, and a portion that applies the driving low-voltage ELVSS to the cathode 410 may have a plurality of locations.

The peripheral data line 171-1 formed in the peripheral area 120 is formed in a first conductive layer that is different from a second conductive layer where the peripheral driving voltage line 181-1 and the peripheral driving low-voltage connection portion 182-1 are formed, and thus, may overlap the second conductive layer in a layout view. In addition, the peripheral driving voltage line 181-1 and the peripheral driving low-voltage connection portion 182-1 are formed in the same conductive layer, and thus, they may be separated from each other in the layout view. The peripheral driving voltage line 181-1 and the peripheral driving low-voltage connection portion 182-1 are formed in the same conductive layer as the driving voltage line 181.

The data line 171 disposed in the display area 110 and the peripheral data line 171-1 disposed in the peripheral area 120 may also be referred to as data wirings hereinafter.

The driving voltage line 181 disposed in the display area 110 and the peripheral driving voltage line 181-1 disposed in the peripheral area 120 may also be referred to as driving voltage wirings hereinafter.

The cathode 410 that extends to the peripheral area 120 while covering the display area 110, and the peripheral driving low-voltage connection portion 182-1 that is disposed in the peripheral area 1120, may be referred to as driving low-voltage wiring. Here, the driving low-voltage wiring may include driving low-voltage lines (refer to 182 and 182' of FIG. 19) that are additionally formed in the display area 110.

The flexible printed circuit board 200 includes a driving chip 250 that applies a data voltage to the data wirings 171 and 171-1. An input wiring 2171 that transmits a signal to the driving chip 250 from the outside and an output wiring 1171-1 that outputs a data voltage from the driving chip 250 are formed in the flexible printed circuit board 200. In addition, the detection signal lines 173 and 173-1 may be connected with the driving chip 250.

The output wiring 1171-1 is connected with the peripheral data line 171-1 disposed in the peripheral area 120. The input wiring 2171 has a structure that receives a signal from the printed circuit board 300.

The flexible printed circuit board 200 further includes a driving voltage transmission line 1181 that applies a driving voltage ELVDD, and a driving low-voltage transmission line 1182 that applies the driving low-voltage ELVSS.

The driving voltage transmission line 1181 is connected with the peripheral driving voltage line 181-1 of the peripheral area 120, and the driving low-voltage transmission line 1182 is connected with the peripheral driving low-voltage connection portion 182-1 of the peripheral area 120.

The printed circuit board 300 includes a driving voltage applying portion 310 that generates and transmits the driving voltage ELVDD, and a driving low-voltage applying portion 320 that generates and transmits the driving low-voltage ELVSS. The printed circuit board 300 includes a driving voltage output line 2181 connected to the driving voltage applying portion 310. The driving voltage output line 2181 is connected with the driving voltage transmission line 1181 of the flexible printed circuit board 200. Thus, the driving voltage ELVDD is transmitted to the display panel 100 from the driving voltage output line 2181 to the driving voltage transmission line 1181. The printed circuit board 300 further includes a driving low-voltage output line 2182 connected to the driving low voltage applying portion 320. The driving low-voltage output line 2182 is connected with the driving low-voltage transmission line 1182 of the flexible printed circuit board 200. Thus, the driving low-voltage ELVSS is transmitted to the display panel 100 from the driving low-voltage output line 2182 to the driving low-voltage transmission line 1182.

The printed circuit board 300 may further include a video driver that divides an externally applied video signal and transmits the divided video signals to the respective driving chips 250 that are disposed, in the flexible printed circuit board 200. The video driver is connected with the input wiring 2171 of the flexible printed circuit board 200 through a video signal transmission line. Thus, the video signal can be transmitted to the driving chip 250.

A structure of the peripheral area 120 in an organic light emitting diode display will now be described in further detail with reference to FIG. 2 and FIG. 3.

Figure 2:
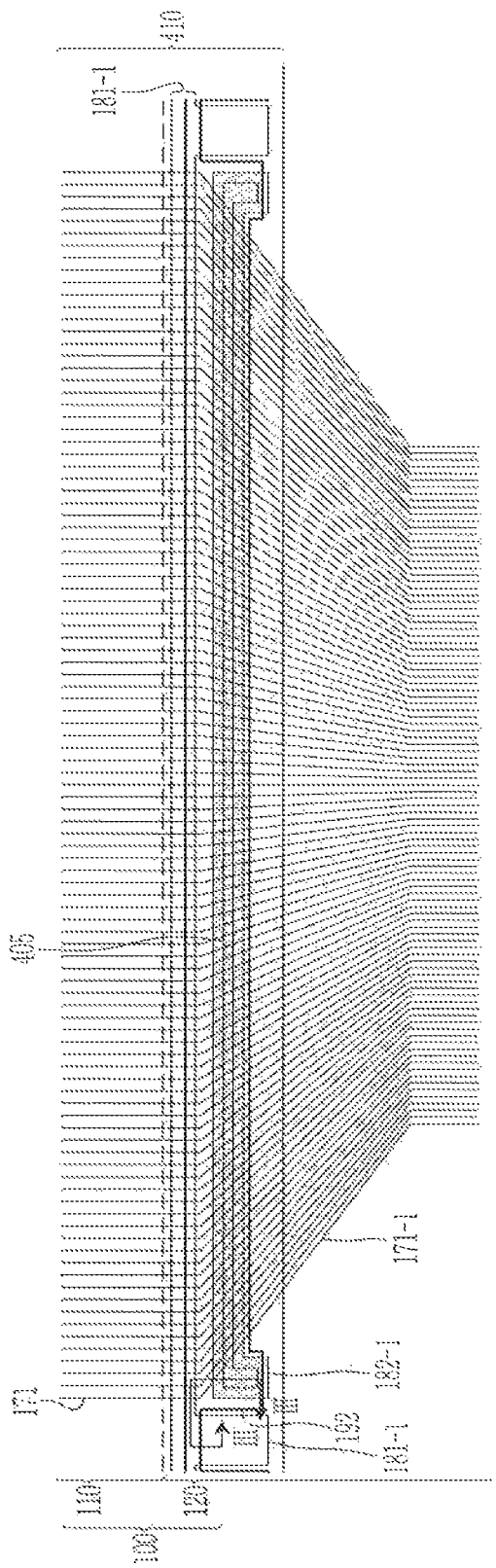
FIG. 2 is an enlarged view of a peripheral area at one side of the organic light emitting diode display according to the exemplar embodiment of FIG. 1.
Figure 3:
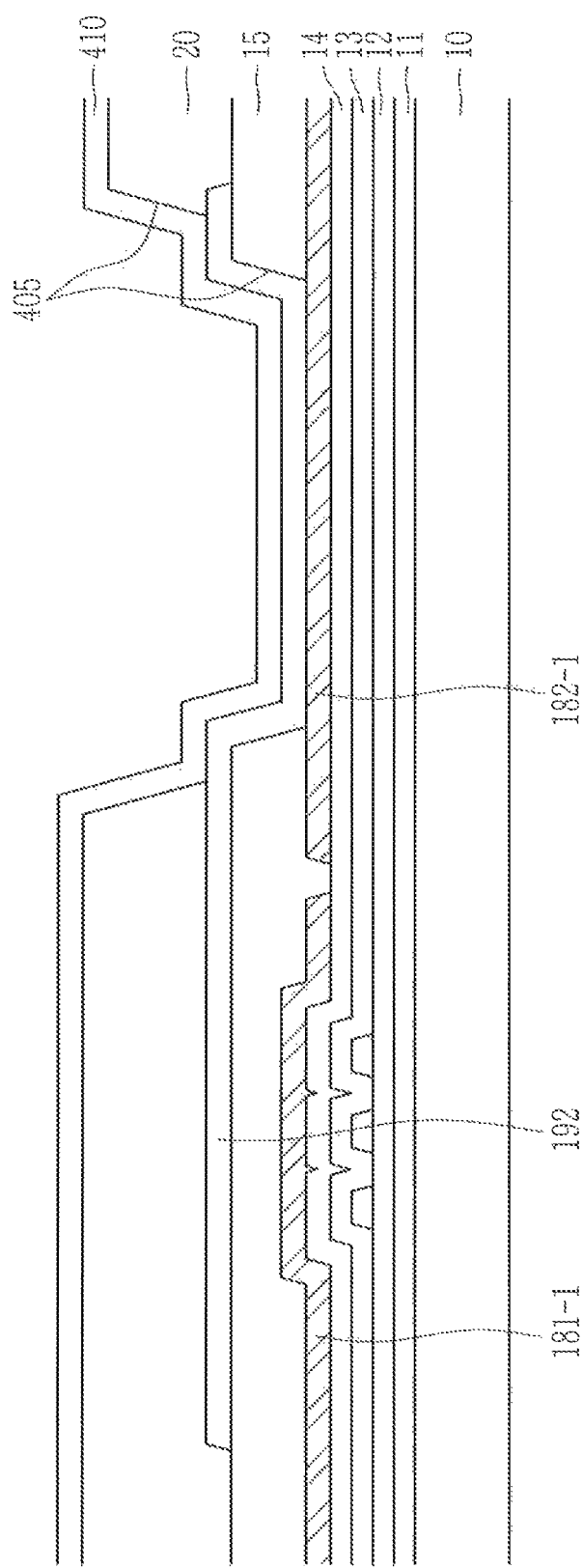
FIG. 3 is a cross-sectional view of FIG. 2, taken along line III-III.

FIG. 2 is an enlarged view of a peripheral area at one side of the organic light emitting diode display according to the exemplary embodiment of FIG. 1, and FIG. 3 is a cross-sectional view of FIG. 2, taken along line III-III.

In FIG. 2, the peripheral area 120 disposed in a lower portion of the display panel 100 is illustrated, and a fan-out area where the peripheral data lines 171-1 are arranged is mainly illustrated.

The data lines 171 are connected to the peripheral data lines 171-1 in the peripheral area 120 while being extended in a vertical direction (e.g., a second direction) in the display area 110, and then, concentrated to a center of the fan-out area by being bent in the fan-out area. Referring to FIG. 3, the peripheral data lines 171-1 are formed in a layer (e.g., a gate conductive layer) where a gate line is formed rather than being formed in a layer (e.g., a data conductive layer) where the data lines 171 are formed. Thus, the data line 171 is formed to extend to a part of the peripheral area 120 while passing through the display area 110 in the data conductive layer, and is electrically connected with the peripheral data line 171-1 formed in the gate conductive layer by a contact structure. Here, the gate conductive layer is formed closer to a semiconductor layer compared to the data conductive layer, and is disposed away from an anode and a cathode.

The peripheral driving voltage line 181-1 and the peripheral driving low-voltage connection portion 182-1 are formed in the data conductive layer of the peripheral area 120. Although the peripheral driving voltage line 181-1 and the peripheral driving low-voltage connection portion 182-1 are formed in the same layer, they are illustrated as being separated. from each other in FIGS. 2 and 3.

The peripheral driving voltage line 181-1 disposed in the peripheral area 120 includes a wiring portion extending in the horizontal direction (e.g., the first direction) and a pad portion protruded downward from the wiring portion. The pad portion of the peripheral driving voltage line 181-1 is disposed between adjacent fan-out areas. The pad portion of the peripheral driving voltage line 181-1 is connected with the driving voltage transmission line 1181 of the flexible printed circuit board 200 and receives the driving voltage ELVDD. The driving voltage ELVDD transmitted to the peripheral driving voltage line 181-1 is transmitted to the driving voltage line 181. By increasing the number of pads protruded from the peripheral driving voltage line 181-1, the driving voltage ELVDD can maintain a constant voltage level in the display area 110. The driving voltage line 181 is formed in the data conductive layer and the peripheral driving voltage line 181-1 is also formed in the data conductive layer, and thus, the driving voltage line 181 and the peripheral driving voltage line 181-1 may have an integrated structure in which they are directly connected without an additional contact structure.

The peripheral driving low-voltage connection portion 182-1 disposed in the peripheral area 120 has a plurality of separated structures. Pad portions are disposed at opposite sides of every connection portion, and a wiring portion is provided between the pad portions to connect the two pad portions. In other words, the peripheral driving low-voltage connection portion 182-1 includes a wiring portion extended in one direction and pad portions respectively protruded from opposite sides of the wiring portion and electrically connected thereto. The peripheral driving voltage line 181-1 has one connected structure as a whole by the connection line, but the peripheral driving low-voltage connection portion 182-1 is formed of a plurality of separated connection portions.

A peripheral driving low-voltage horizontal connection portion 192 (hereinafter also referred to as a second driving low-voltage connection portion) that is electrically connected by an opening 405 is formed on the peripheral driving low-voltage connection portion 182-1.

The peripheral driving low-voltage horizontal connection portion 192 includes a wiring portion extended in the horizontal direction (e.g., the first direction) and a contact portion that is electrically connected while being protruded downward from the wiring portion. The contact portion of the peripheral driving low-voltage horizontal connection portion 192 overlaps the peripheral driving low-voltage connection portion 182-1, and is electrically connected with the peripheral driving low-voltage connection portion 182-1 through the opening 405. For example, the peripheral driving low-voltage horizontal connection portion 192 directly contacts the peripheral driving low-voltage connection portion 182-1 in the opening 405. The wiring portion of the peripheral driving low-voltage horizontal connection portion 192 overlaps the peripheral driving voltage line 181-1, but an area that overlaps the peripheral driving voltage line 181-1 is kept smaller than a predetermined size to prevent the occurrence of a short circuit. In other words, an area where the wiring portion of the peripheral driving low-voltage horizontal connection portion 192 and the wiring portion of the peripheral driving voltage line 181-1 overlap each other may be formed to be half or less than half of a width of the wiring portion of the peripheral driving voltage line 181-1. In addition, the peripheral driving low-voltage horizontal connection portion 192 does not protrude in the pad portion of the peripheral driving voltage line 181-1, and thus, an overlapped area with the peripheral driving voltage line 181-1 can be reduced.

The cathode 410 is disposed on the peripheral driving low-voltage horizontal connection portion 192, and thus, the cathode 410 and the peripheral driving low-voltage horizontal connection portion 192 are electrically connected with each other through the opening 405. For example, the cathode 410 and the peripheral driving low-voltage horizontal connection portion 192 directly contact each other in the opening 405.

In FIG. 2, one opening 450 is illustrated, but referring to FIG. 3, the opening 405 may be formed in two insulation layers (e.g., an organic insulation layer 15 and a barrier rib 20). Thus, the peripheral driving low-voltage connection portion 182-1, the peripheral driving low-voltage horizontal connection portion 192, and the cathode 410 are sequentially connected with each other. Due to such a connection structure, the driving low-voltage ELVSS applied to the pad portion of the peripheral driving low-voltage connection portion 182-1 is transmitted to the cathode 410 through the peripheral driving low-voltage horizontal connection portion 192.

Since the peripheral driving low-voltage connection portion 182-1 is a data conductive layer in the fan-out area, the peripheral driving low-voltage connection portion 182-1 can be easily electrically connected with the cathode 410 through the opening 405.

The driving voltage ELVDD and the driving low-voltage ELVSS should be transmitted as individual voltages to the pixels PX, respectively, but there is a possibility that the peripheral driving voltage line 181-1 to which the driving voltage ELVDD is applied and wirings (e.g., the peripheral driving low-voltage connection portion 182-1 and the peripheral driving low-voltage horizontal connection portion 192) to which the driving low-voltage ELVSS is applied may be adjacent to each other or overlap each other in the peripheral area 120, thereby causing a short circuit. Thus, an area where the peripheral driving low-voltage horizontal connection portion 192 and the peripheral driving voltage line 181-1 overlap each other is minimized in the present exemplary embodiment to prevent the occurrence of such a short circuit. In other words, the peripheral driving voltage line 181-1 and the peripheral driving low-voltage connection portion 182-1 that are adjacent to each other are formed in the same layer (e.g. the data conductive layer) by using the same mask. Since they are formed by the same mask, they can be formed at a predetermined distance from each other. However an opening 405 formed thereon may be changed in location due to misalignment of the mask. When the opening 450 is inappropriately located, an overlapping area of the peripheral driving low-voltage horizontal connection portion 192 and the peripheral driving voltage line 181-1 may be increased, thereby increasing the possibility that they will connected with each other in the misaligned opening 405. However in the present exemplary embodiment, the driving low-voltage horizontal connection portion 192 overlaps the peripheral driving voltage line 181-1 with a minimum area such that the occurrence of a short circuit can be prevented even if the opening 405 is misaligned.

The cathode 410 not only covers the entire display area 110 but is also formed in the peripheral region 120, and referring to FIG. 2, the cathode 410 covers the peripheral driving low-voltage connection portion 182-1, the peripheral driving voltage line 181-1, and the peripheral driving low-voltage horizontal connection portion 192. However, according to exemplary embodiments of the present invention, the cathode 410 may overlap only the peripheral driving low-voltage connection portion 182-1, the peripheral driving voltage line 181-1, or a part of the peripheral driving low-voltage horizontal connection portion 192.

In FIG. 3, a location relationship of the respective wirings will be described through a cross-sectional view.

Referring to FIG. 3, a buffer layer 11 is stacked on a substrate 10. The substrate 10 may be a flexible substrate such as a glass substrate or a plastic substrate. A metal layer may be formed on the substrate 10, in addition, a semiconductor layer is formed on the buffer layer 11, and no semiconductor layer is formed in the peripheral area 120. A gate insulation layer 12 is stacked on the buffer layer 11. The gate conductive layer is formed on the gate insulation layer 12, and the peripheral data lines 171-1 are formed in the peripheral area 120. An interlayer insulation layer 14 that covers the peripheral data line 171-1, and the gate insulation layer 12 is formed on the peripheral data line 171-1 and the gate insulation layer 12. According to exemplary embodiments of the present invention, a layer used to form the pixels PX may include a second gate conductive layer. In this case, a second gate insulation layer 13 may be further provided between the interlayer insulation layer 14 and the gate insulation layer 12. In addition, according to exemplary embodiments of the present invention, the peripheral data lines 171-1 may be formed as the second gate conductive layer.

The data conductive layer is formed on the interlayer insulation layer 14, and the peripheral driving voltage line 181-1 and the peripheral driving low-voltage connection portion 182-1 are formed in the peripheral area 120. The peripheral driving voltage line 181-1 may have a directly connected structure since the driving voltage line 181 of the display area 110 is formed in the data conductive layer.

The organic insulation layer 15 that covers the peripheral driving voltage line 181-1 and the peripheral driving low-voltage connection portion 182-1 is formed on the peripheral driving voltage line 181-1 and the peripheral driving low-voltage connection portion 182-1. An anode may be formed on the organic insulation layer 15, and the peripheral driving low-voltage horizontal connection portion 192 may be formed in the peripheral area 120. The peripheral driving low-voltage horizontal connection portion 192 is connected with the peripheral driving low-voltage connection portion 182-1 through the opening 405 formed in the organic insulation layer 15. The barrier rib 20 is formed on the organic insulation layer 15 and the peripheral driving low-voltage connection portion 182-1 to cover the organic insulation layer 15 and the peripheral driving low-voltage connection portion 182-1. A cathode 410 is formed on the barrier rib 20, and the cathode 410 and the peripheral driving low-voltage connection portion 182-1 are electrically connected with each other through the opening 405 formed in the barrier rib 20.

Hereinabove, a structure in which the display peripheral driving low-voltage horizontal connection portion 192 and peripheral driving voltage line 181-1 are extended in a horizontal direction while reducing an overlapped area therebetween has been described.

Hereinafter, referring to FIG. 4 and FIG. 5, a structure in which a peripheral driving low-voltage horizontal connection portion 192 is formed while not overlapping a peripheral driving voltage line 181-1, except for a pact portion of the peripheral driving voltage line 181-1, will be described.

Figure 4:
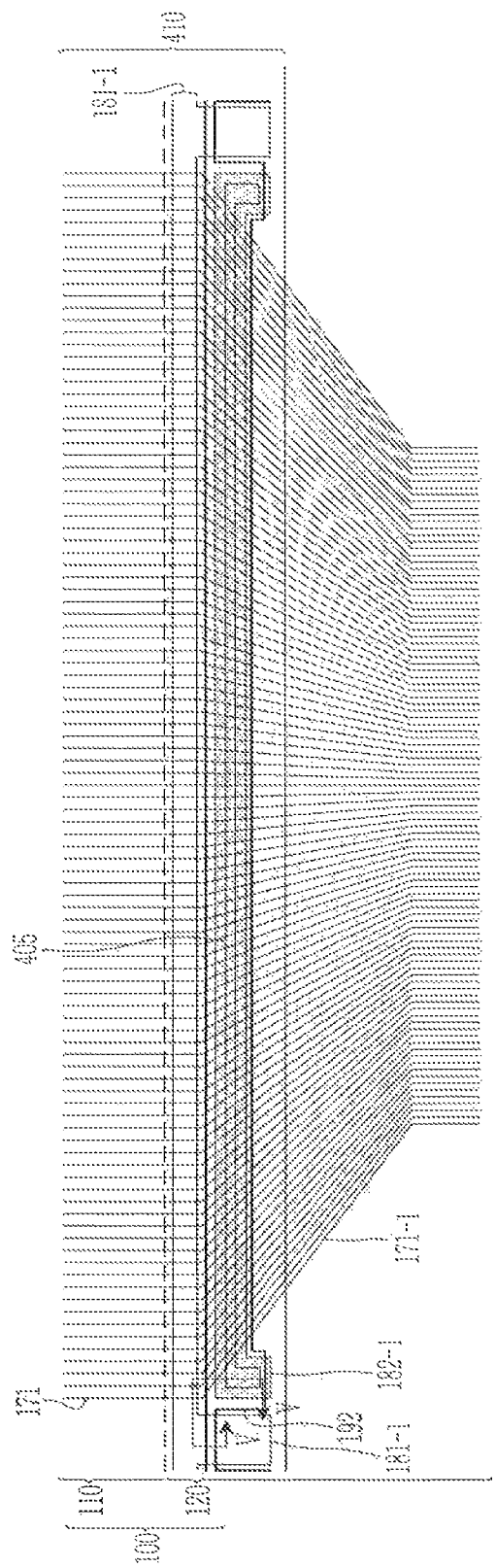
FIG. 4, FIG. 6, and FIG. 8 are enlarged views of a peripheral area at one side of an organic light emitting diode according to another exemplary embodiment of the present invention.
Figure 5:
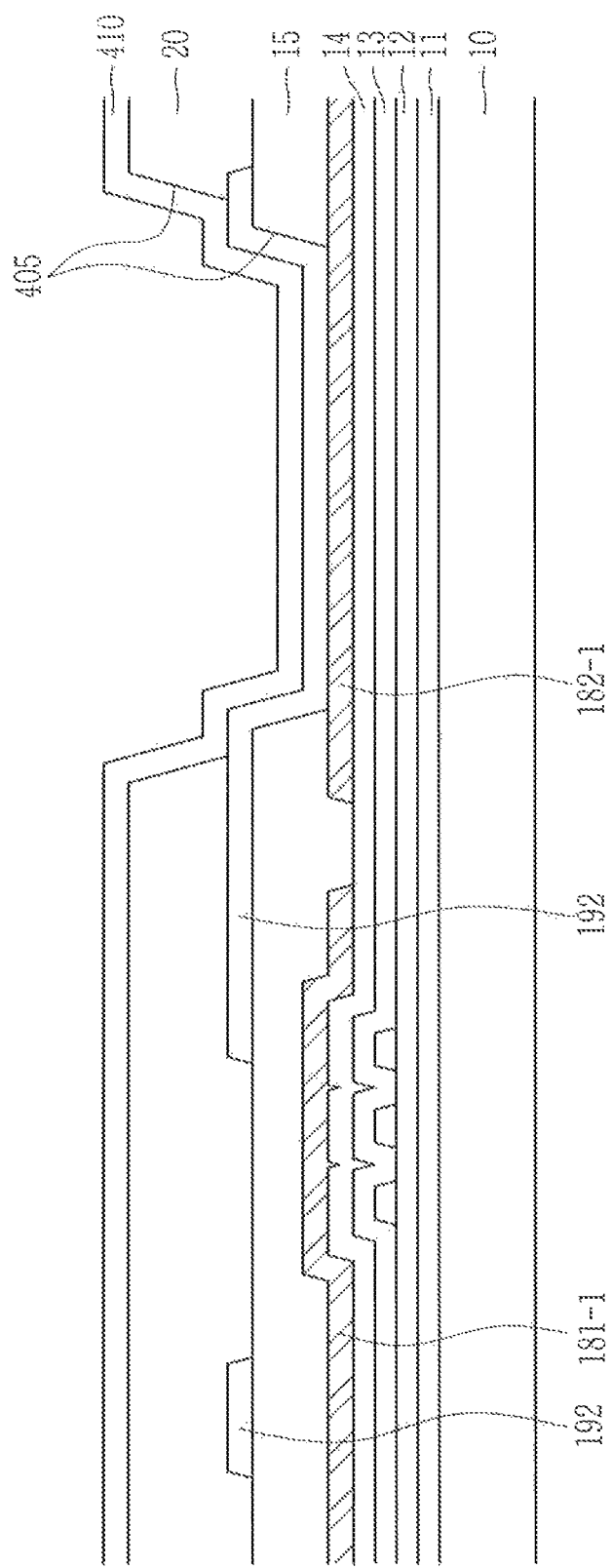
FIG. 5 is a cross-sectional view of FIG. 4, taken long line V-V.

FIG. 4 is an enlarged view of one peripheral area of an organic light emitting diode display according to another exemplary embodiment of the present invention, and FIG. 5 is a cross-sectional view of FIG. 4, taken along line V-V.

First, referring to FIG. 4, compared to FIG. 2, a peripheral driving low-voltage horizontal connection portion 192 only overlaps a pad portion of a peripheral driving voltage line 181-1, while not overlapping a wiring portion of the peripheral driving voltage line 181-1.

As a result, an area where the peripheral driving voltage line 181-1 and the peripheral driving low-voltage horizontal connection portion 192 overlap each other is minimized. For example, an opening is located farther away from the pad portion of the peripheral driving voltage line 181-1 such that the peripheral driving low-voltage connection portion 182-1 and the peripheral driving low-voltage horizontal connection portion 192 can be electrically connected with each other. Therefore, an occurrence of a short circuit of the peripheral driving voltage line 181-1 and the peripheral driving low-voltage horizontal connection portion 192 due to a misalignment of the opening 405 may not occur in the exemplary embodiment of FIG. 4.

A difference can also be determined in reference FIG. 5.

In other words, compared to FIG. 3, in FIG. 5, a structure in which the peripheral driving low-voltage horizontal connection portion 192 that is disposed on the peripheral driving voltage line 181-1 on a cross-sectional view is not formed in a partial area. In other words, an area of the peripheral driving voltage line 181-1 is not overlapped by the peripheral driving low-voltage horizontal connection portion 192. Thus, due to the area where the peripheral driving voltage line 181-1 does not overlap the peripheral driving low-voltage horizontal connection portion 192, the possibility of a short circuit between the two wirings (e.g., the peripheral driving voltage line 181-1 and the peripheral driving low-voltage horizontal connection portion 192) is reduced.

Hereinafter, an exemplary embodiment of the present invention shown in FIG. 6 and FIG. 7 will be described.

Figure 6:
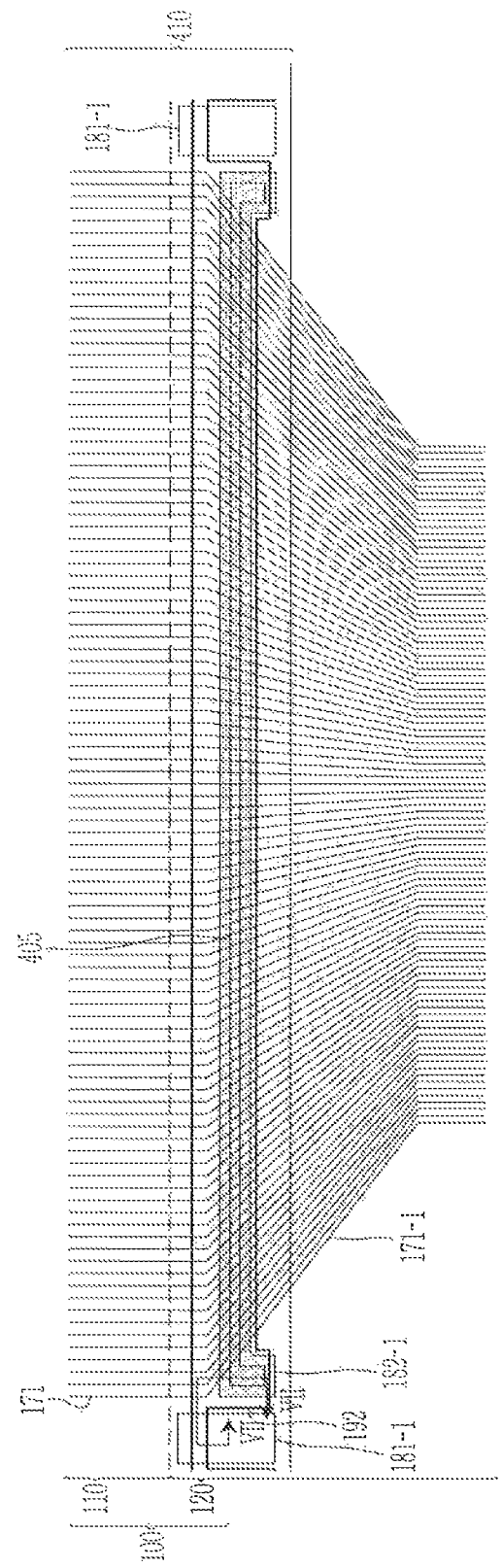
Figure 7:
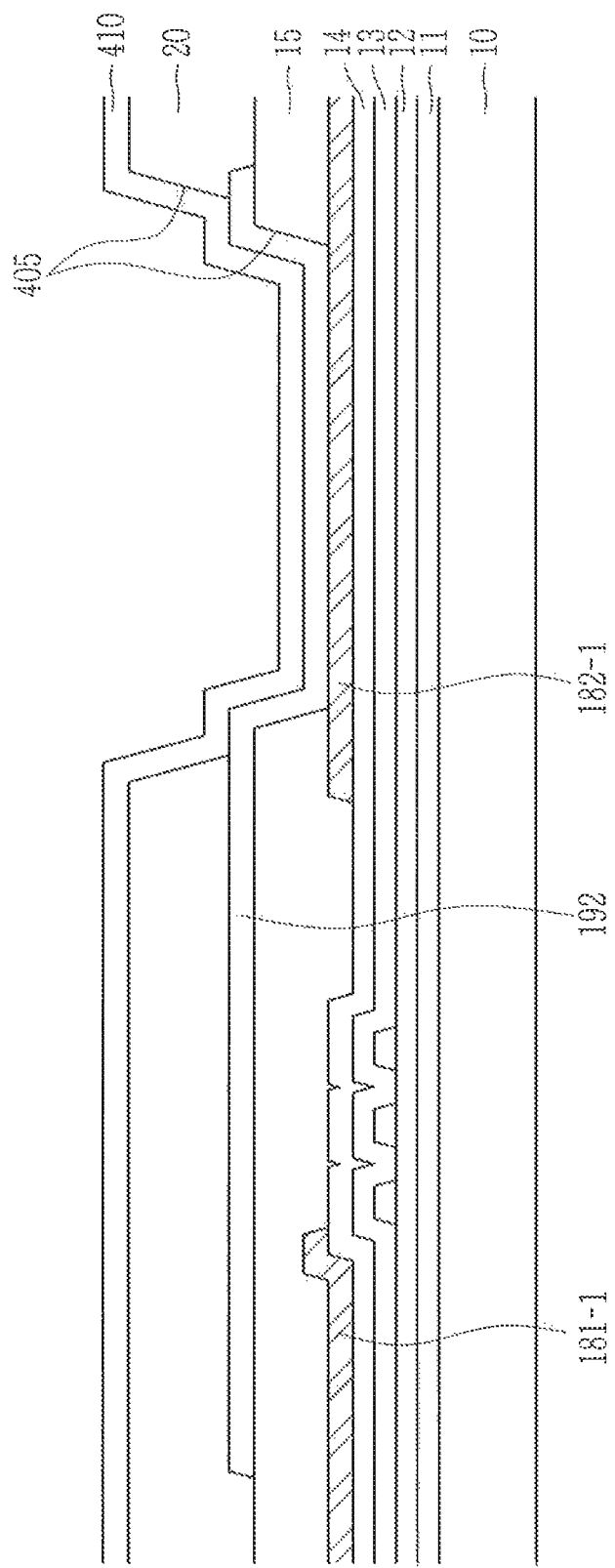
FIG. 7 is a cross-sectional view of FIG. 6, taken along line VII-VII.

FIG. 6 is an enlarged view of one peripheral area of an organic light emitting diode display according to another exemplary embodiment of the present invention, and FIG. 7 is a cross-sectional view of FIG. 6, taken along line VII-VII.

In FIG. 6 and FIG. 7, an exemplary embodiment of the present invention in which only a pad portion is expanded rather than forming a wiring portion that horizontally extends from a peripheral driving voltage line 181-1 to reduce an area overlapped with a peripheral driving low-voltage horizontal connection portion 192 is illustrated.

Compared to FIG. 2, a structure of the peripheral driving voltage line 181-1 is different in FIG. 6.

In other words, the peripheral driving voltage line 181-1 according to the exemplary embodiment of the present invention shown in FIG. 6 has a structure as follows.

Figure 19:
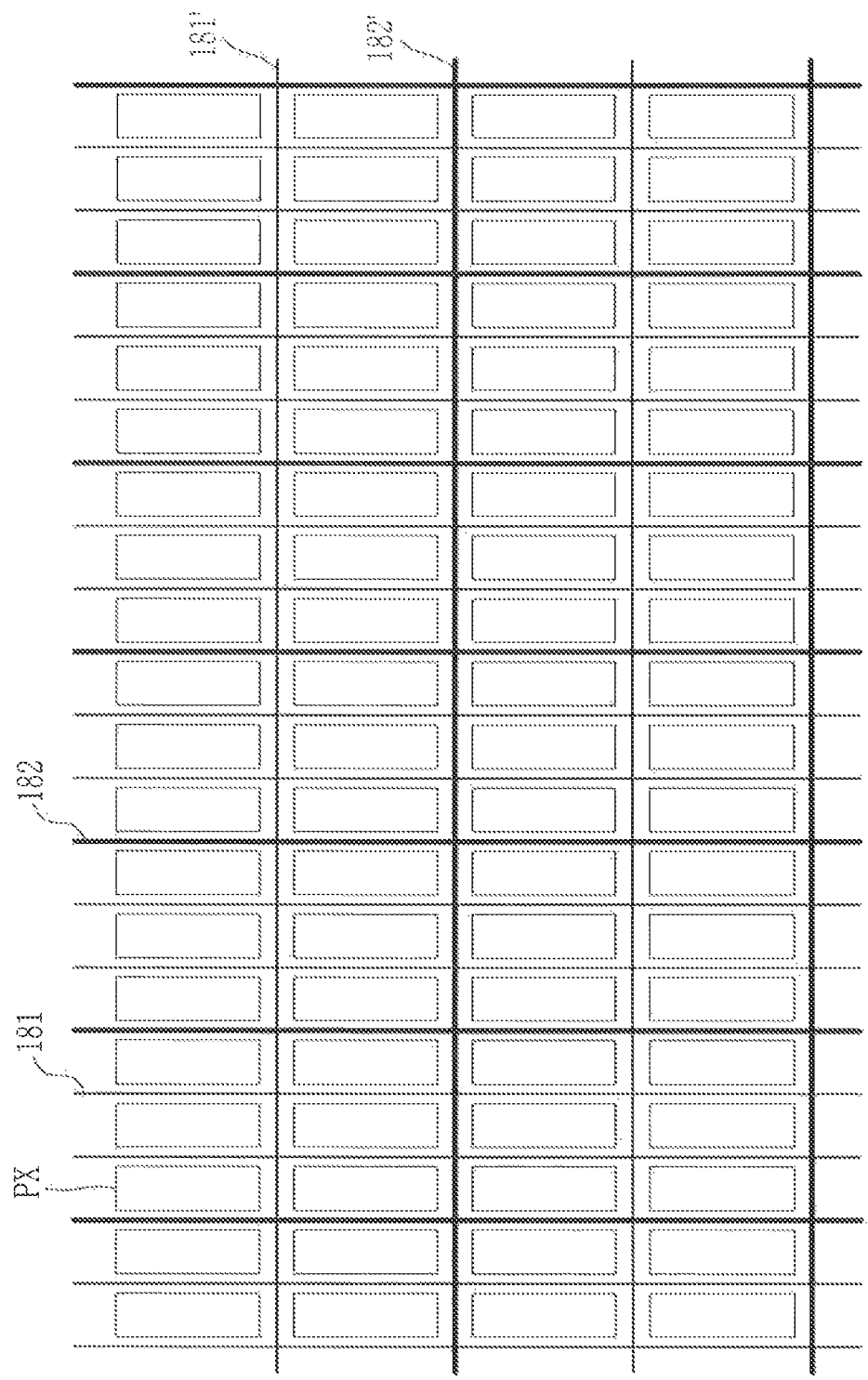
FIG. 19 is a schematic diagram of a display area of the organic light emitting diode display according to an exemplary embodiment of the present invention.

For example, in FIG. 6, the peripheral driving voltage line 181-1 disposed in a peripheral area 120 does not include a wiring portion extended in a horizontal direction (e.g., a first direction), and only includes a pad portion protruded in a downward direction (e.g., a second direction) and electrically connected thereto. The pad portion extends to an area adjacent to a display area 110, and is formed of a plurality of pad portions that are separately formed from each other. Although it is not expressly illustrated in FIG. 6, as shown in FIG. 19, driving voltage wirings that apply a driving voltage ELVDD include a driving voltage line 181 and a horizontal driving voltage line 181' (hereinafter also referred to as a second driving voltage line), which are formed in the shape of a mesh in the display area 110. Thus, although the peripheral driving voltage line 181-1 disposed in the peripheral area 120 does not extend in the first direction, the entire display area 110 has a constant driving voltage ELVDD by virtue of the mesh structure connection of the display area 110. The peripheral driving voltage line 181-1 shown in FIG. 6 may be formed in a data conductive layer and thus directly connected with the driving voltage line 181. of the display area 110 without an additional contact structure. In other words, in the structure of FIG. 6, when the driving voltage ELVDD is applied through the pad portion, the driving voltage ELVDD may be applied to only a part of the driving voltage line 181 of the display area 110. However, since the horizontal driving voltage line 181' is provided in the display area 110, the driving voltage lines 1.81 are connected each other by the horizontal driving voltage line 181'. Thus, the driving voltage ELVDD can be applied to all of the display area 110.

This will be described with reference to a cross-sectional structure shown in FIG. 7.

Compared to FIG. 3, in FIG. 7, an area where the peripheral driving voltage line 181-1 and the peripheral driving low-voltage horizontal connection portion 192 overlap each other is reduced. FIG. 6 also illustrates this reduction in overlap.

Thus, since the area where the peripheral driving voltage line 181-1 and the peripheral driving low-voltage horizontal connection portion 192 overlap each other is reduced, they may not be electrically connected with each other even if an opening 405 is misaligned.

Hereinabove, the exemplary embodiments of the present invention in which the peripheral driving low-voltage horizontal connection portion 192 is formed have been described with reference to FIG. 2 to FIG. 7.

Hereinafter, an exemplary embodiment of the present invention in which a peripheral driving low-voltage horizontal connection portion 192 is omitted will be described with reference to FIG. 8 and FIG. 9.

Figure 8:
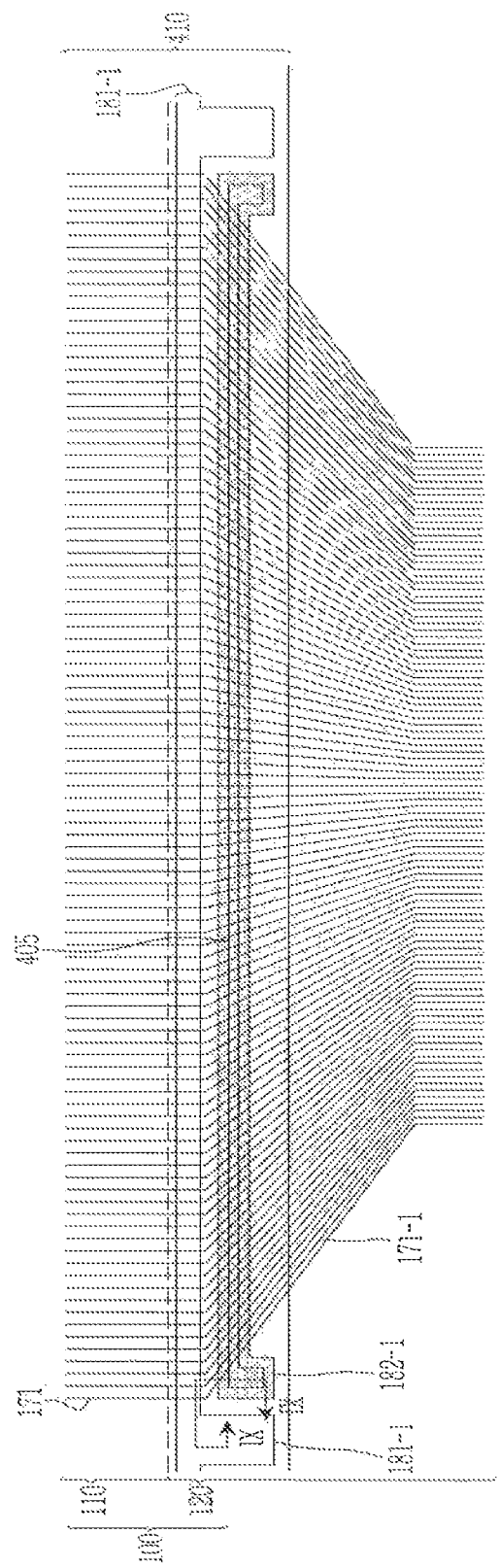
Figure 9:
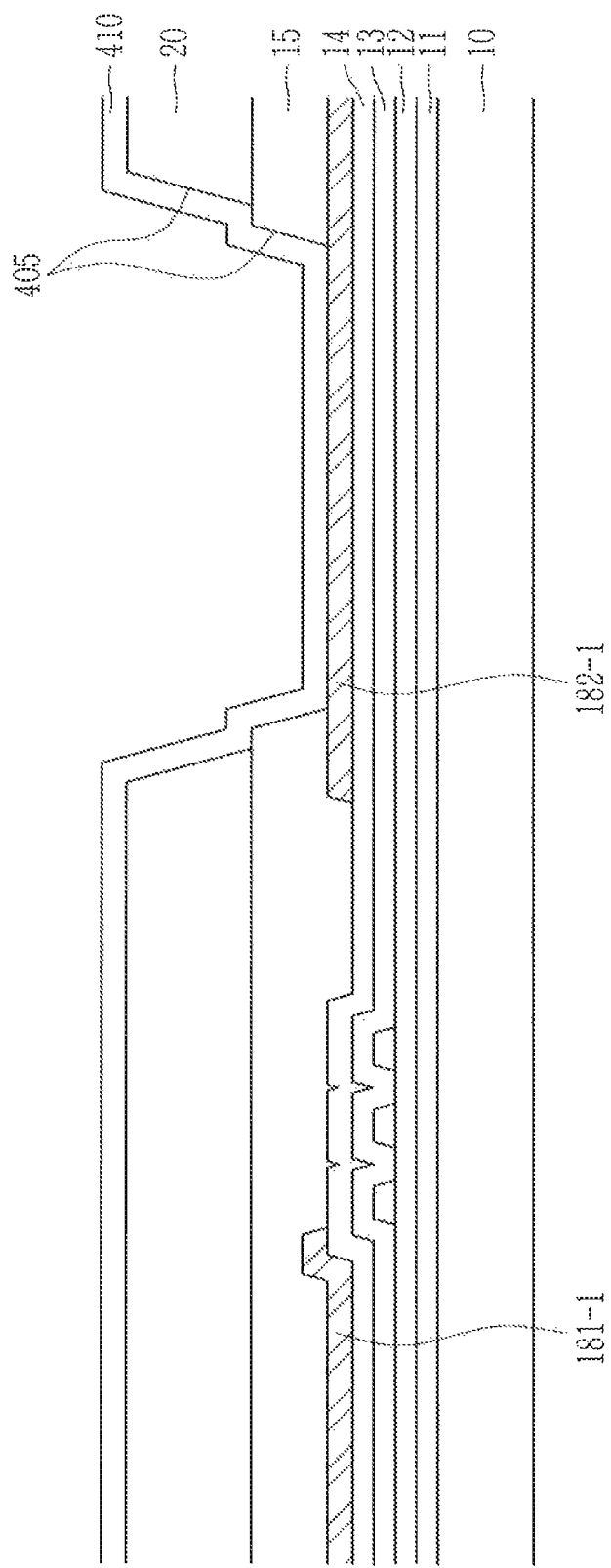
FIG. 9 is a cross-sectional view of FIG. 8, taken along line IX-IX.

FIG. 8 is an enlarged view of one peripheral area of an organic light emitting diode display according to another exemplary embodiment of the present invention, and FIG. 9 is a cross-sectional view of FIG. 8, taken along line IX-IX.

Referring to FIG. 8, a peripheral driving low-voltage horizontal connection portion 192 is formed, unlike in FIG. 2, FIG. 4, and FIG. 6. Thus, in the present exemplary embodiment, when a peripheral driving low-voltage connection. portion 182-1 and a cathode 410 are electrically connected with each other, they are directly connected with each other rather than being connected through a layer disposed in an anode.

Referring to FIG. 9, in the present exemplary embodiment, the peripheral driving low-voltage connection portion 182-1 is disposed in a data conductive layer, and the cathode 410 is formed in a cathode layer that is disposed on the anode. The cathode 410 and the peripheral driving low-voltage connection portion 182-1 are directly connected with each other through an opening 405.

In the exemplary embodiment of the present invention shown in FIG. 8 and FIG. 9, the possibility of the peripheral driving voltage line 181-1 being connected with a wiring that transmits a driving low voltage ELVSS is further reduced. When the peripheral driving low-voltage horizontal connection portion 192 is disposed in the anode, the opening 450 formed in the organic insulation layer 15 causes a short circuit, but as shown in FIG. 9, when two the insulation layers (e.g., the organic insulation layer 15 and the barrier rib 20) are disposed between the peripheral driving voltage line 181-1 and the cathode 410 that overlaps the peripheral driving voltage line 181-1, the possibility of a short circuit can be reduced as long as the opening 405 is not misaligned. In addition, the parasitic capacitance between the peripheral driving voltage line 181-1 and the cathode electrode 410 may be reduced as the overlapping distance increases.

Hereinabove, the peripheral area at the lower side of the display device has been described.

Hereinafter, a peripheral area at an upper side of the organic light emitting diode display will be described.

An exemplary embodiment of the present invention shown in FIG. 10 to FIG. 12 will now be described.

Figure 10:
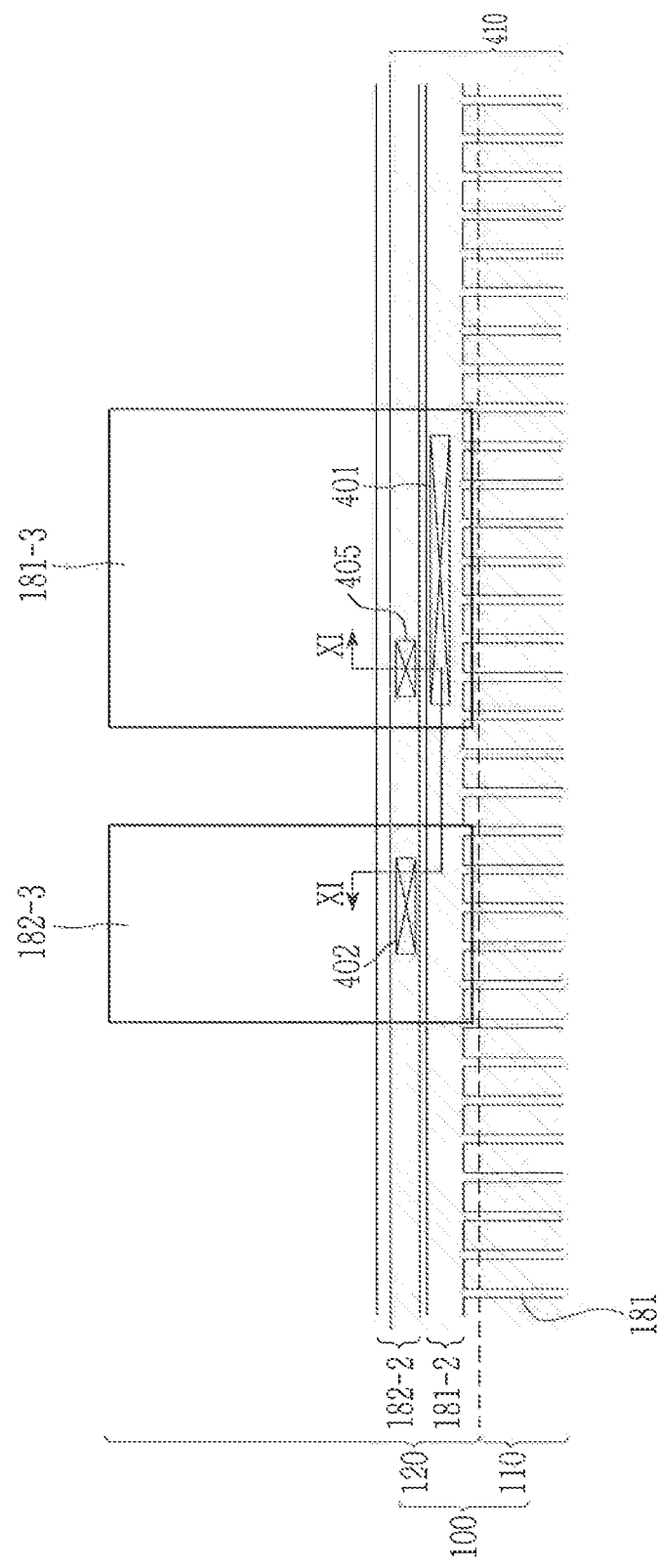
FIG. 10 is an enlarged view of a peripheral area at the other side of an organic light emitting diode display according to an exemplary embodiment of the present invention.
Figure 11:
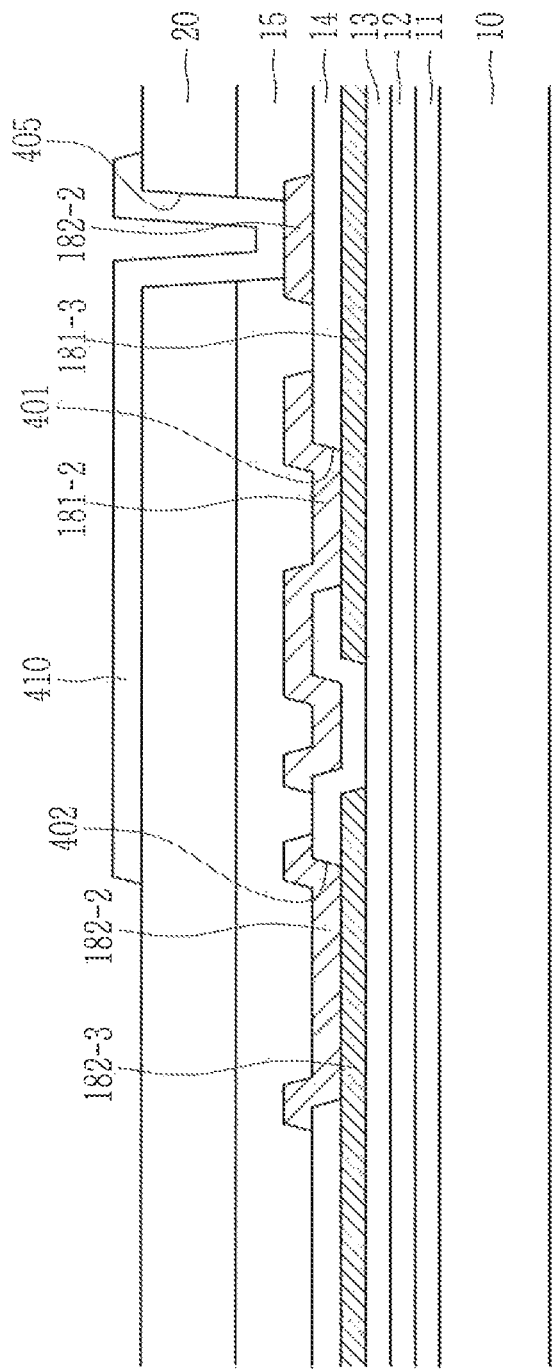
FIG. 11 and FIG. 12 are cross-sectional views of FIG. 10, taken along line XI-XI.
Figure 12:
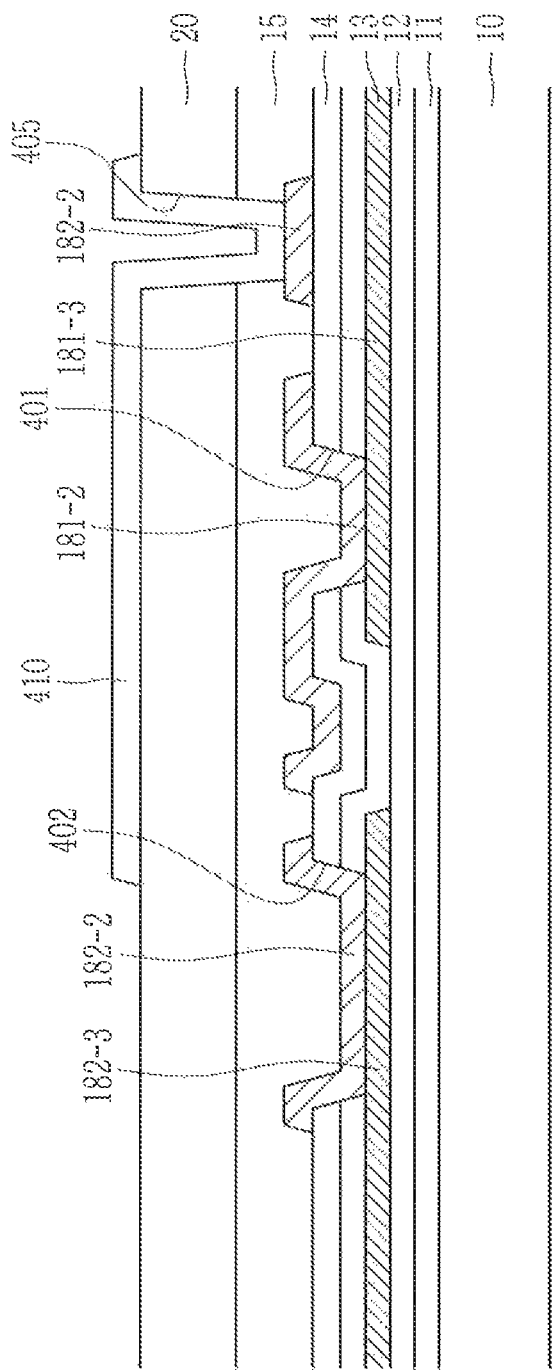

FIG. 10 is an enlarged view of the other peripheral area of the organic light emitting diode display according to an exemplary embodiment of the present invention, and FIG. 11 and FIG. 12 are cross-sectional views of FIG. 10, taken along line XI-XI.

First, FIG. 10 will be described.

A peripheral area 120 is disposed at an upper side of a display area 110 within the display panel 100. A peripheral driving voltage wiring and a peripheral driving low-voltage wiring are formed in the peripheral area 120 of the upper side of the display area 110. Here, unlike the peripheral driving low-voltage connection portion 182-1 of the peripheral area 120 in the lower side, the peripheral driving low voltage wiring in the upper side extends in a horizontal direction and thus is integrally formed. In addition, in the peripheral area 120 of the upper side, a driving voltage pad 181-3 that transmits a driving voltage ELVDD and a driving low-voltage pad 182-3 that transmits a driving low-voltage ELVSS are respectively included.

The peripheral driving voltage wiring that is disposed at the upper peripheral area 120 and transmits the driving voltage ELVDD will now be described.

The peripheral driving voltage wiring at the upper side includes a second peripheral driving voltage line 181-2 and the driving voltage pad 181-3. Unlike the peripheral driving voltage line 181-1, which is a peripheral driving voltage wiring in the lower side, the peripheral driving voltage wiring at the upper side is separately formed rather than being integrally formed, and only has a electrical connection, for example.

Referring to FIG. 10, the second peripheral driving voltage line 181-2 is formed in a data conductive layer and thus is formed in the same layer as the driving voltage line 181 of the display area 110. Thus, as shown in FIG. 10, the second peripheral driving voltage line 181-2 is integrally formed with the driving voltage line 181. Unlike as Shown in FIG. 2, in FIG. 10, the driving voltage line 181 has a predetermined width because FIG. 10 is an enlarged view. This can be determined through comparison of a size of the pad in FIG. 2 and FIG. 10. Such a size difference can also be changed according to exemplary embodiments of the present invention.

In addition, the driving voltage pad 181-3 extends in a vertical direction, and overlaps with the second peripheral driving voltage line 181-2 at an end of the peripheral area 120. In FIG. 10, only one driving voltage pad 181-3 is illustrated, but a plurality of driving voltage pads 181-3 may be included at a plurality of locations. Unlike the second peripheral driving voltage line 181-2, the driving voltage pad 181-3 is formed in a gate conductive layer that is disposed in a lower portion of the data conductive layer. The gate conductive layer may be formed as two layers (e.g., a first gate conductive layer and a second gate conductive layer) according to exemplary embodiments of the present invention, but the driving voltage pad 181-3 may be formed in either of the two layers. In the cross-sectional view of FIG. 11, the driving voltage pad 181-3 is formed in the second gate conductive layer, and in the cross-sectional view of FIG. 12, the driving voltage pad 181-3 is formed in the first gate conductive layer.

The second peripheral driving voltage line 181-2 and the driving voltage pad 181-3 are directly connected with each other through an opening 401, and thus, the driving voltage ELVDD input to the driving voltage pad 181-3 is applied to the second peripheral driving voltage line 181-2, and thus, the driving voltage ELVDD is applied to the driving voltage line 181 of the display area 110.

In addition, the peripheral driving low-voltage wiring that is disposed in the upper peripheral area 120 and transmits the driving low-voltage ELVSS includes a second peripheral driving low-voltage line 182-2 and a driving low-voltage pad 182-3. The driving low-voltage wiring disposed in the lower peripheral area 120 has a structure in which a separately formed connection portion is provided in plural, but the second peripheral driving low-voltage line 182-2 in the upper peripheral area 120 is integrally extended in a horizontal direction. However, the second peripheral driving low-voltage line 182-2 does not include a pad connected thereto, and includes a separately formed driving low-voltage pad 182-3.

Referring to FIG. 10, the second peripheral driving low-voltage line 182-2 is formed in the data conductive layer, and extends in a horizontal direction. Thus, a structure in which the plurality of peripheral driving low-voltage connection portions 182-1 are disposed in a lower portion is different from a structure in which one second peripheral driving low-voltage line 182-2 is integrally formed in the display panel 100.

In addition, the driving low-voltage pad 182-3 extends in a vertical direction, and overlaps the second peripheral driving low-voltage line 182-2 at an end of the peripheral area 120. In FIG. 10, only one driving low-voltage pad 182-3 is illustrated, but a plurality of driving low-voltage pads 182-3 may be included at a plurality of locations. Unlike the second peripheral driving low-voltage line 182-2, the driving low-voltage pad 182-3 is formed in a gate conductive layer that is located at a lower portion of the data conductive layer, and according to exemplary embodiments of the present invention, the driving low-voltage pad 182-3 may be disposed in the first gate conductive layer (refer to FIG. 11) or on the second gate conductive layer (refer to FIG. 12) that is disposed on the first gate conductive layer.

The second peripheral driving low-voltage line 182-2 and the driving low-voltage pad 182-3 are directly connected with each other by an opening 402, and thus, the driving low-voltage ELVSS input to the driving low-voltage pad 182-3 is applied to the second peripheral driving low-voltage line 182-2.

The second peripheral driving low-voltage line 182-2 includes a portion exposed by an opening 405, and is electrically connected with a cathode 410 (indicated by hatching in FIG. 10) through the exposed portion. The opening 405 is disposed on the second peripheral driving voltage line 181-2 in FIG. 10, but the location of the opening 405 may be any location that can expose the second peripheral driving low-voltage line 182-2. Thus, the driving low-voltage ELVSS applied to the driving low-voltage pad 182-3 is transmitted to the cathode 410 through the second peripheral driving low-voltage line 182-2.

The exemplary embodiments of the present invention shown in FIG. 11 and FIG. 12 show a difference of layers where the driving voltage pad 181-3 and the driving low-voltage pad 182-3 are formed, respectively. Due to such a layer difference, the exemplary embodiment of the present invention shown in FIG. 12 may have fewer shorts compared to the exemplary embodiment of the present invention shown in FIG. 11. In other words, referring to FIG. 10, the driving voltage pad 181-3 overlaps a portion of the second peripheral driving low-voltage line 182-2 that applies the driving low-voltage ELVSS. In this case, when the number of insulation layers between the driving voltage pad 181-3 and the second peripheral driving low-voltage line 182-2 is small, parasitic capacitance is increased and a short circuit may occur due to misalignment and dielectric breakdown. However, when the number of insulation layers is increased as in the exemplary embodiment of the present invention shown in FIG. 12, parasitic capacitance is decreased and the possibility of a short circuit may be reduced.

As shown in FIG. 11 and FIG. 12, the cathode 410 arid the second peripheral driving low-voltage line 182-2 are directly connected with each other on the organic insulation layer 15 without having a layer that is disposed in the anode. This is a structure in which a connection member is not included in the anode like the lower peripheral area 120 shown in FIG.

8 and FIG. 9, and thus, the possibility of a short circuit between the driving voltage wiring and the driving low-voltage wiring is removed.

Figure 13:
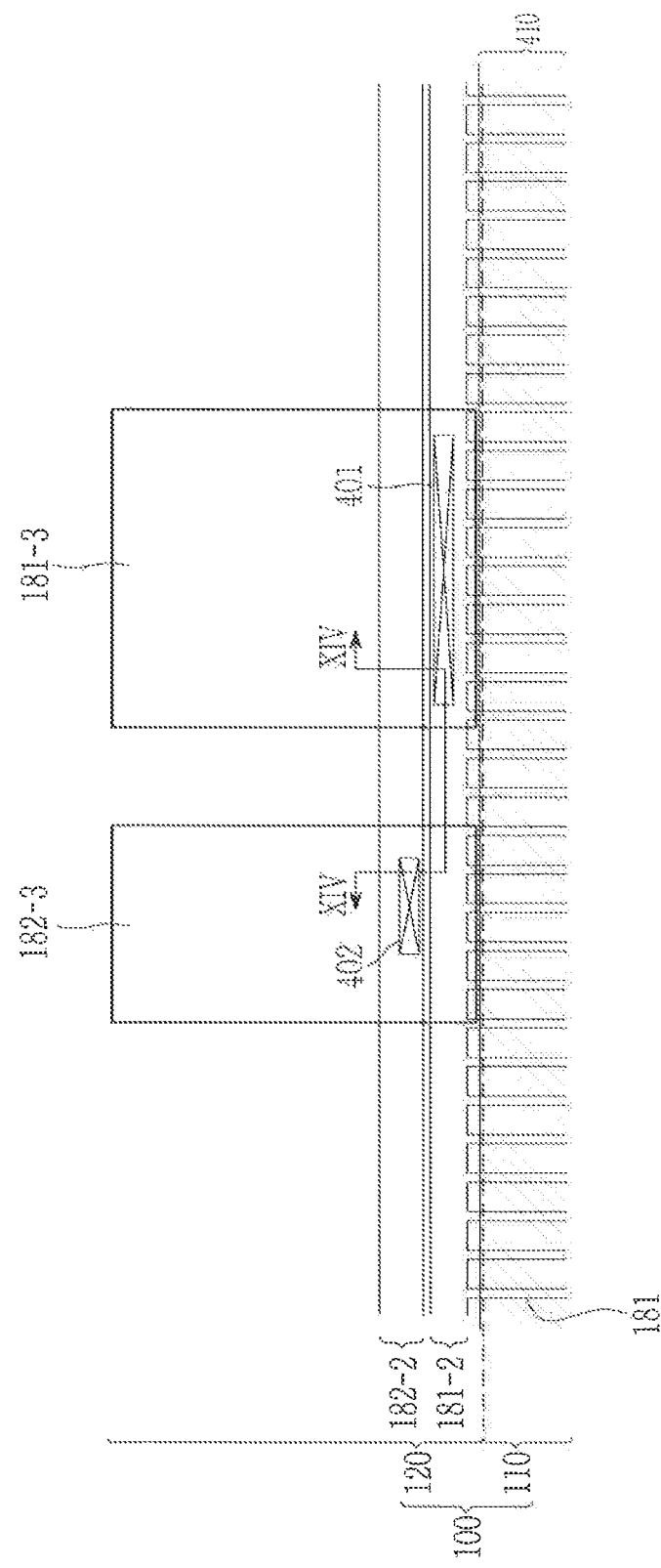
FIG. 13 and FIG. 15 are enlarged views of a peripheral area at the other side of an organic light emitting diode display according to another exemplary embodiment of the present invention.
Figure 14:
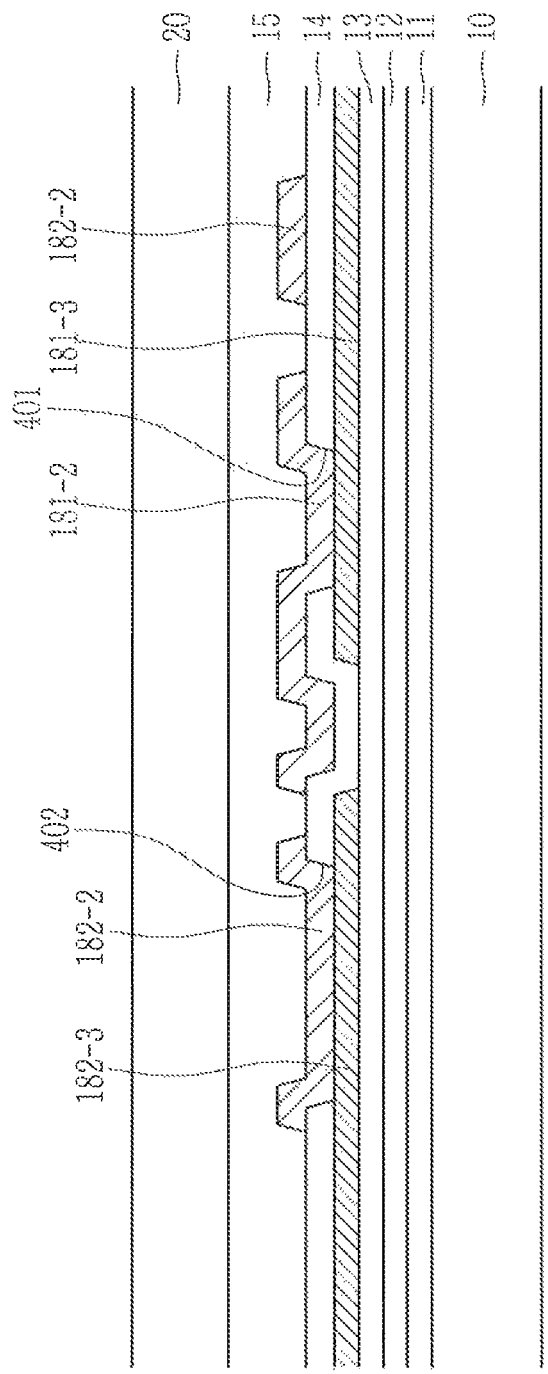
FIG. 14 is a cross-sectional view of FIG. 13, taken along line XIV-XIV.

Further, to reduce the possibility of a short circuit between the driving voltage wiring and the driving low-voltage wiring, FIG. 13 and FIG. 14 illustrate exemplary embodiments of the present invention in which a cathode 410 does not overlap a second peripheral driving voltage line 181-2.

FIG. 13 is an enlarged view of the other side peripheral area of an organic light emitting diode display according to another exemplary embodiment of the present invention, and FIG. 14 is a cross-sectional view of FIG. 13, taken along line XIV-XIV.

Compared to FIG. 10 to FIG. 12, the exemplary embodiment of the present invention shown in FIG. 13 and FIG. 14 does not have a structure in which a cathode 410 does not overlap a second peripheral driving voltage line 181-2 in a peripheral area 120. In this case, a driving low-voltage ELVSS may not be applied to the cathode 410 through an upper peripheral area. In other words, the cathode 410 is provided with the driving low-voltage ELVSS through a lower peripheral area, and may also receive the driving low-voltage ELVSS, through left and right sides of the peripheral area 120. In addition, as shown in FIG. 19, driving low-voltage lines 182 and 182' applying the driving low-voltage ELVDD are arranged in a network structure in the display area 110, and thus, the cathode 410 can be prevented from being applied with a different driving low-voltage ELVSS at each location.

However according to exemplary embodiments of the present invention, the driving low-voltage ELVSS can be applied to the cathode 410 in the upper peripheral area at some locations, and in this case, the structure shown in FIG. 10 to FIG. 12 may be formed only in the corresponding locations.

In addition, the exemplary embodiment of the present invention shown in FIG. 14 is a structure corresponding to FIG. 11, in which a driving low-voltage pad 182-3 is disposed in a second gate conductive layer. However, according to exemplary embodiments of the present invention, the driving low-voltage pad 182-3 may be disposed in the first gate conductive layer.

Figure 15:
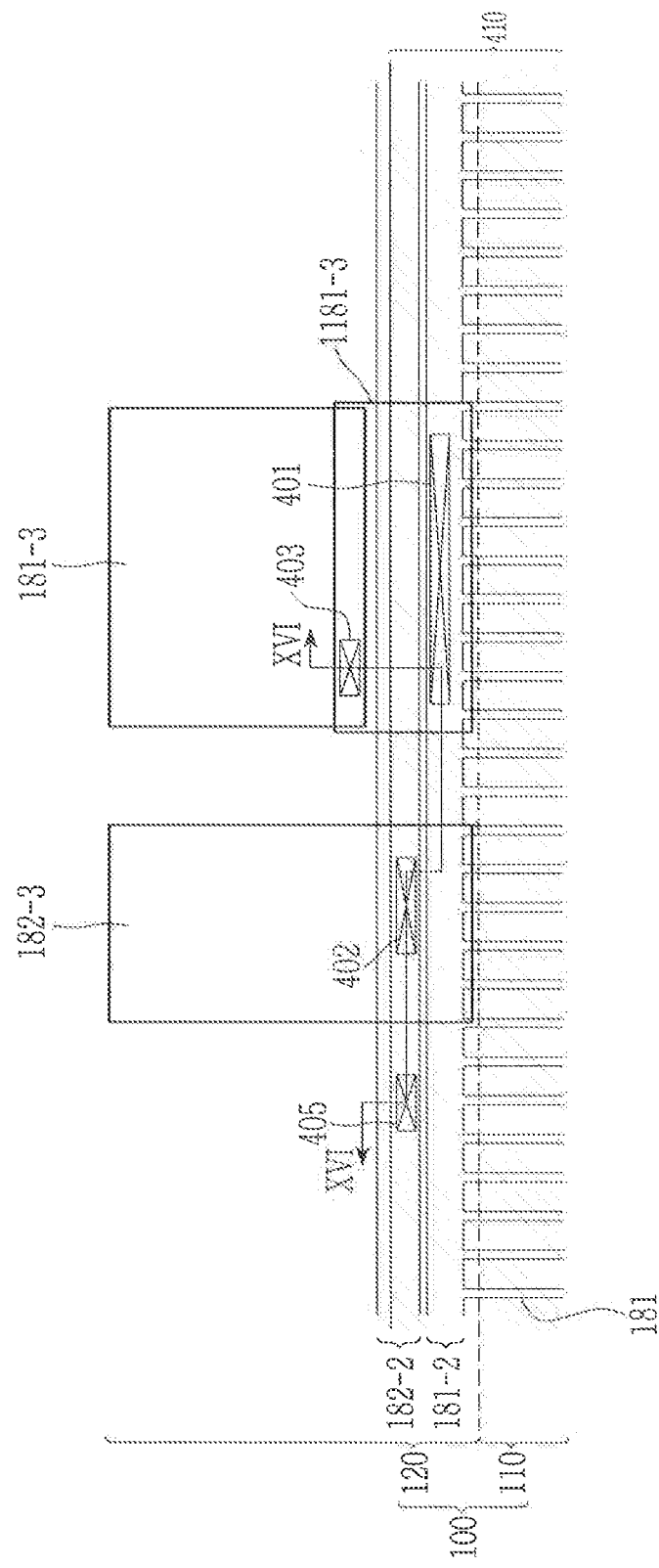
Figure 16:
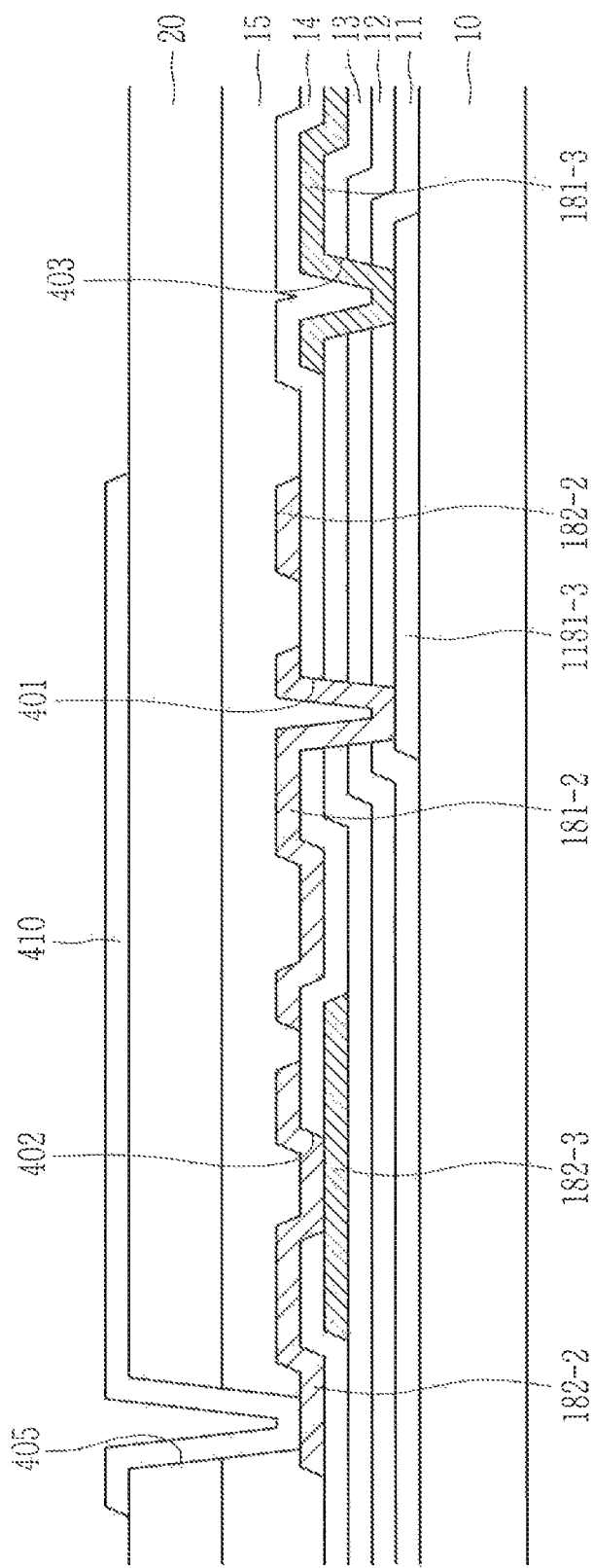
FIG. 16 and FIG. 17 are cross-sectional views of FIG. 15, taken along litre XVI-XVI.

Hereinafter, an exemplary embodiment of the present invention shown in FIG. 15 and FIG. 16 will be described. In FIG. 15 and FIG. 16, the number of insulation layers between a driving voltage pad 181-3 and a second peripheral driving low-voltage line 182-2 is increased to remove a short circuit which may occur in a portion where the second peripheral driving low-voltage line 182-2 and the driving voltage pad 181-3 overlap each other.

FIG. 15 is an enlarged view of the other peripheral area of an organic light emitting diode display according to another exemplary embodiment of the present invention, and FIG. 16 is a cross-sectional view of FIG. 15, taken along line XVI-XVI.

Unlike in FIG. 10 to FIG. 13, in FIG. 15, the driving voltage pad 181-3 does not extend to the second peripheral driving voltage line 181-2. A peripheral driving voltage connection portion 1181-3 (hereinafter also referred to as a first driving voltage connection portion) is further included to be connected with the second peripheral driving voltage line 181-2. The peripheral driving voltage connection portion 1181-3 is disposed below a semiconductor layer, and is formed in a metal layer that is disposed on a substrate 10.

The peripheral driving voltage connection portion 1181-3 extends in a vertical direction, and connects between the driving voltage pad 181-3 and the second peripheral driving voltage line 181-2. In other words, referring to FIG. 16, the driving voltage pad 181-3 and the peripheral driving voltage connection portion 1181-3 are connected with each other through an opening 403, and the second peripheral driving voltage line 181-2 and the peripheral driving voltage connection portion 1181-3 are connected with each other through an opening 401. Therefore, the driving voltage pad 181-3 and the second peripheral driving voltage line 181-2 are connected to each other. Thus, a driving voltage ELVDD applied through the driving voltage pad 181-3 is applied to the second peripheral driving voltage line 181-2 through the peripheral driving voltage connection portion 1181-3, and then, transmitted to the driving voltage line 181 of the display area 1110 through the second peripheral driving; voltage line 181-2.

Further, the metal layer can be formed on the substrate 10 to have lower resistance than the gate conductive layer.

In addition, according to exemplary embodiments of the present invention, the peripheral driving voltage connection portion 1181-3 may be formed in a layer other than the metal layer. Such a structure will be described with reference to FIG. 17.

Figure 17:
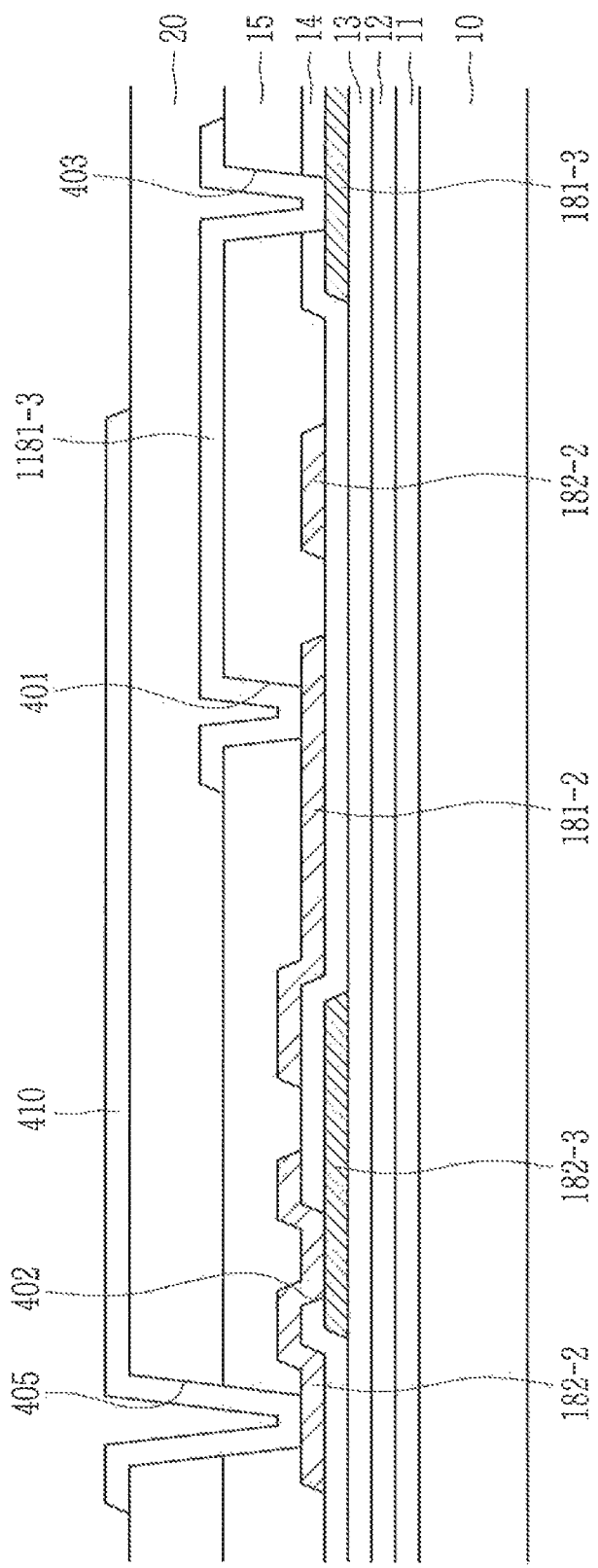

FIG. 17 is a cross-sectional view of FIG. 15, taken along line XVI-XVI.

FIG. 17 illustrates a structure in which the peripheral driving voltage connection portion 1181-3 is disposed in an anode.

Referring to FIG. 17, the driving voltage pad 181-3 and the peripheral driving voltage connection portion 1181-3 are connected with each other through the opening 403, and the second peripheral driving voltage line 181-2 and the peripheral driving voltage connection portion 1181-3 are connected through the opening 401. Thus, the driving voltage ELVDD applied through the driving voltage pad 181-3 is applied to the second peripheral driving voltage line 181-2 through the peripheral driving voltage connection portion 1181-3, and thus, is transmitted to the driving voltage line 181 of the display area 110 through the second peripheral driving voltage line 181-2.

Compared to the exemplary embodiment of the present invention shown in FIG. 17, the exemplary embodiment of the present invention Shown in FIG. 16 has low resistance, low parasitic capacitance between the driving voltage wiring and the driving low-voltage wiring, and the possibility of a short circuit is smaller. However, according to exemplary embodiments of the present invention, the peripheral driving voltage connection portion 1181-3 may be formed in the anode as shown in FIG. 17.

Hereinabove, the exemplary embodiments of the present invention in which the peripheral driving voltage line 181-1 and the peripheral driving low-voltage connection portion 182-1, and the second peripheral driving voltage line 181-2 and the second peripheral driving low-voltage line 182-2, are formed in the same layer have been described.

However, according to exemplary embodiments of the present invention, these lines may be disposed in different layers, thereby reducing the possibility of a short circuit. As an example, an exemplary embodiment of the present invention having the peripheral driving voltage line 181-1 and the peripheral driving low-voltage connection portion 182-1 in different layers will now be described with reference to FIG. 18.

Figure 18:
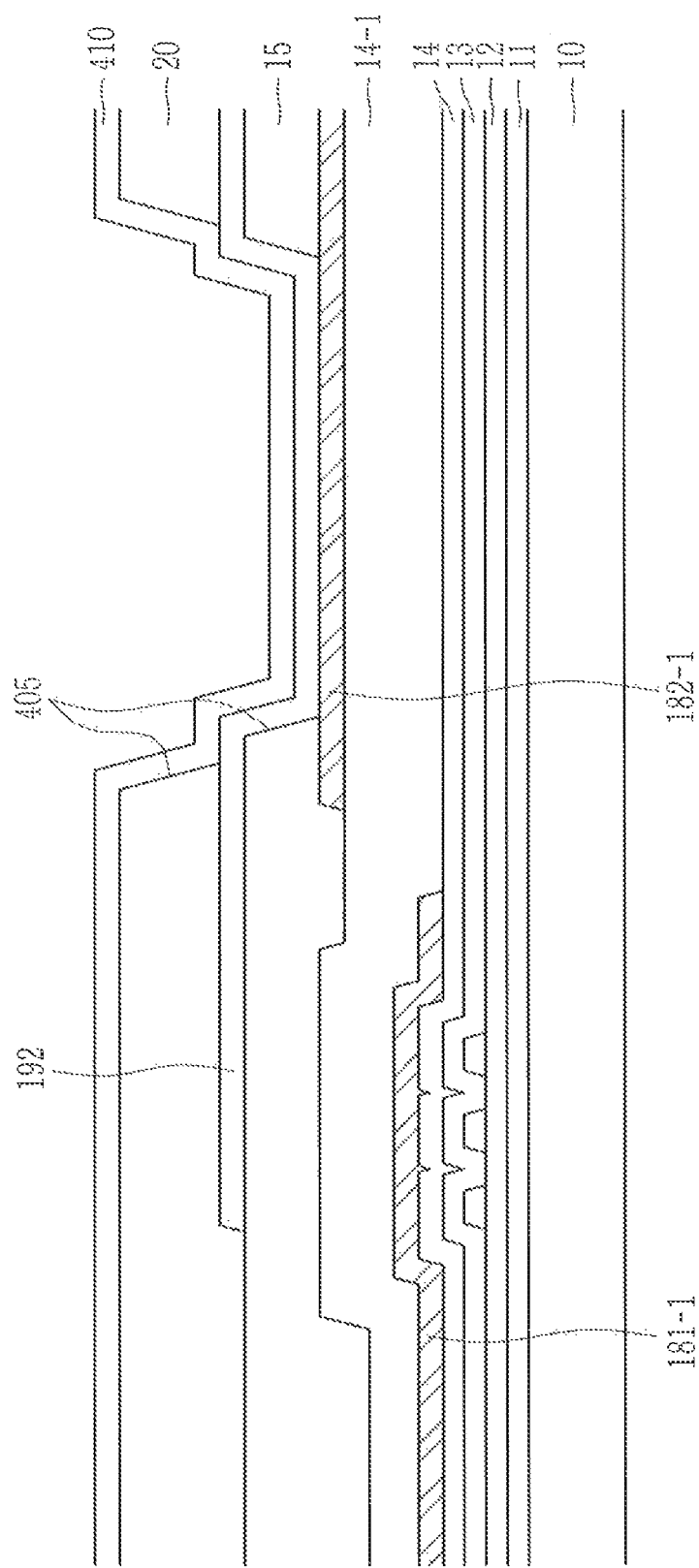
FIG. 18 is a cross-sectional view of an organic light emitting diode display according to an exemplary embodiment of the present invention.

FIG. 18 is a cross-sectional view of an organic light emitting diode display according to an exemplary embodiment of the present invention.

FIG. 18 is a cross-sectional view corresponding to the cross-sectional view of FIG. 3, and the peripheral driving voltage line 181-1 and the peripheral driving low-voltage connection portion 182-1 are formed in different layers. In other words, the peripheral driving voltage line 181-1 is disposed on an interlayer insulation layer 14 and is thus formed as a first data conductive layer, and the peripheral driving low-voltage connection portion 182-1 is disposed on a second interlayer insulation layer 14-1 and is thus formed as a second data conductive layer. In this case, two masks are required, thereby causing an increase of manufacturing cost; however, the possibility of a short circuit between driving voltage wiring to which a driving voltage ELVDD is applied and driving low-voltage wiring to which a driving low-voltage ELVSS is applied can be further reduced. For example, pixels of a display device are condensed as the number of pixels thereof is gradually increased to 4K, 8K, and so on, and accordingly, a gap between the driving voltage wiring and the driving low-voltage wiring can be reduced. Thus, an exemplary embodiment of the present invention in which the driving voltage wring and the driving low-voltage wiring are formed in different layers as shown in FIG. 18 may be used even though manufacturing cost is increased.

In addition, a second peripheral driving voltage line 181-2 and a second peripheral driving low-voltage line 182-2 may be formed in different layers in accordance with exemplary embodiments of the present invention.

Hereinabove, the structure of the driving voltage wiring and the driving low-voltage wiring in peripheral areas 120 disposed in upper and lower sides of the display area 110 has been described. However, the driving voltage wiring and the driving low-voltage wiring may also be formed in peripheral areas 120 disposed in left and right sides of the display area 110. In this case, the structure of the driving voltage wiring and the driving low-voltage wiring may be similar to the structure in which the driving voltage wiring and the driving low-voltage wiring are formed in the upper peripheral area. However, except for a fan-out structure, the driving voltage wiring and the driving low-voltage wiring may be formed in a lower peripheral area according to exemplary embodiments of the present invention.

Hereinabove various examples of the driving voltage wiring and the driving low-voltage wiring have been described. However, the present invention is not limited thereto and additional variations as to which layer each wiring is formed are contemplated.

Hereinafter, a structure in which driving voltage wiring and driving low-voltage wiring are disposed in a display area 110 will be described with reference to FIG. 19.

FIG. 19 is a schematic diagram of a display area of an organic light emitting diode display according to an exemplary embodiment of the present invention.

FIG. 119 schematically illustrates driving voltage lines 181 and 181' and driving low-voltage lines 182 and 182' disposed between pixels PX.

In the exemplary embodiment of the present invention shown in FIG. 19, the driving voltage lines 181 and 181' include driving voltage lines 181 (also referred to as vertical driving voltage lines) in a vertical direction and driving voltage lines 181' (also referred to as horizontal driving voltage lines) in a horizontal direction, which are formed in a network or mesh-like structure. The vertical driving voltage lines 181 are disposed in a data conductive layer, and the horizontal driving voltage lines 181' are disposed in the data conductive layer or in another layer and thus electrically connected through an opening.

In addition, the driving low-voltage lines 182 and 182' include driving low-voltage lines 182 (also referred to as vertical driving voltage lines or second driving low-voltage lines) in the vertical direction and driving low-voltage lines 182' (also referred to as horizontal driving low-voltage lines or first driving low-voltage lines) in the horizontal direction, which are formed in a network or mesh-like structure. The vertical driving low-voltage lines 182 are disposed in the data conductive layer, and the horizontal driving low-voltage lines 182' are disposed in the data conductive layer or in another layer. When the vertical driving low-voltage lines 182 and the horizontal driving low-voltage lines 182' are disposed in different layers, they may be electrically connected with each other through an opening. Since the cathode 410 covers the entire display area 110, even when one of the vertical driving low-voltage line 182 and the horizontal driving low-voltage line 182' is omitted, the remaining line may form a network structure by being connected with the cathode 410, and accordingly, one of the vertical driving low-voltage line 182 and the horizontal driving low-voltage line 182' can be omitted, In addition, in FIG. 19, the vertical driving voltage line 181 is not disposed in a portion where the vertical driving low-voltage line 182 is disposed; however, according to exemplary embodiments of the present invention, the vertical driving voltage line 181 can be disposed in a portion where the vertical driving low-voltage line 182 is disposed.

In FIG. 19, the display area 110 includes the driving voltage lines 181 and 181' and the driving low-voltage lines 182 and 182', but according to exemplary embodiments of the present invention, only the driving voltage lines 181 and 181' may have a network structure, and the driving low-voltage lines 182 and 182' may not have a network structure. However, according to an exemplary embodiment of the present invention, the driving voltage lines 181 and 181' may not have a network structure, and only the driving low-voltage lines 182 and 182' may have a network structure.

Hereinafter, a structure of a pixel used in the present exemplary embodiment will be described with reference to a circuit diagram of FIG. 20.

Figure 20:
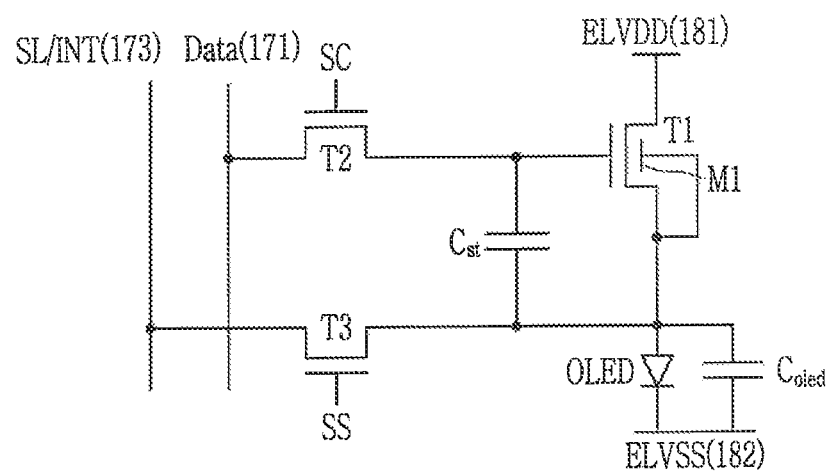
FIG. 20 is a circuit diagram of a pixel of the organic light emitting diode display according to an exemplary embodiment of the present invention.

FIG. 20 is a circuit diagram of a pixel of an organic light emitting diode display according to an exemplary embodiment of the present invention.

A pixel PX according to the present exemplary embodiment includes three transistors T1,T2, and T3, an organic light emitting diode (OLED), and two capacitors Cst and Coled. In addition, as signal lines a gate line SC, a previous gate line SS, a data line 171, a driving voltage line 181, a detection signal line 173, and a driving low-voltage line 182 are included. Here, the detection signal line 173 also functions as an initialization voltage line that applies an initialization voltage INT.

The pixel PX of FIG. 20 includes a driving transistor T1, a switching transistor, e.g., a second transistor T2, connected to the gate line SC, and an initialization transistor, e.g., a third transistor T3 (hereinafter also referred to as a detection transistor) connected to the previous gate line SS. The third transistor T3 may be connected with a signal line that transmits a gate-on voltage at a different timing than the previous gate line SS.

The gate line SC is connected to a gate driver and transmits a scan signal to the second transistor T2, and extends in a horizontal direction.

The previous gate line SS is connected to the gate driver, and transmits a pre-scan signal applied to a pixel PX disposed at a previous stage to the third transistor T3. Like the gate line SC, the previous gate line SS also extends in the horizontal direction.

The data line 171 extends in a vertical direction, and is a wiring that receives a data voltage (e.g., Data) from a driving chip 250 and transmits the received data voltage to the pixel PX.

The detection signal line 173 also extends in the vertical direction, and a single detection signal line 173 may be formed in each row of the plurality of pixels PX.

The driving voltage line 181 applies a driving voltage ELVDD, and the driving low-voltage line 182 applies a driving low-voltage FLVSS. The driving voltage line 181 extends in the vertical direction, and may further include a portion that extends in a horizontal direction and may be formed in a mesh structure according to exemplary embodiments of the present invention.

The driving low-voltage line 182 may be formed as a cathode 410 that wholly covers the pixels PX of the display area 110. However, when the cathode 410 is provided with a single plate structure, a voltage difference may occur. To prevent the voltage difference, the driving low-voltage line 182 may also further include a mesh structure that includes a portion extended in a horizontal direction and a portion extended in a vertical direction.

Hereinafter, a plurality of transistors will be described.

First, the driving transistor T1 is a transistor that controls a current output according to a data voltage applied to a gate electrode, and an output driving current is applied to the organic light emitting diode OLED to adjust a brightness of the organic light emitting diode OLED according to the data voltage. For example, a first electrode (e.g., input side electrode) of the driving transistor T1 is disposed to receive the driving voltage ELVDD, and a second electrode (e.g., output side electrode) is connected with an anode of the organic light emitting diode OLED. In addition, a gate electrode of the driving transistor T1 is connected with a second electrode (e.g., output side electrode) of the second transistor T2 to receive the data voltage.

In addition, the gate electrode of the driving transistor T1 is connected with a first electrode of a storage capacitor Cst. The storage capacitor Cst controls the data voltage transmitted to the gate electrode of the driving transistor T1 to be maintained for one frame period. Thus, a voltage of the gate electrode of the driving transistor T1 is changed according to a voltage stored in the storage capacitor Cst, and accordingly, a driving current output from the driving transistor T1 is changed and output constantly for one frame period.

In addition, according to exemplary embodiments of the present invention, the driving transistor T1 may also have a metal layer M1 below a semiconductor layer where a channel is disposed. Such a metal layer M1 may overlap the channel and the gate electrode of the driving transistor T1, thereby improving characteristics of the driving transistor and maintaining a voltage of the gate electrode of the driving transistor T1. The metal layer M1 may be electrically connected with the second electrode of the driving transistor T1, and is connected with a voltage of the anode of the organic light emitting diode OLED. However, according to exemplary embodiments of the present invention, the driving voltage ELVDD may be transmitted to the metal layer M1.

The second transistor T2 (hereinafter also referred to as a switching transistor) is a transistor that receives a data voltage in a pixel PX. A gate electrode of the second transistor T2 is connected with the gate line SC, a first electrode thereof is connected with the data line 171, and a second electrode thereof (e.g., output side electrode) is connected with the gate electrode of the driving transistor T1. When the second transistor T2 is turned on according to a scan signal transmitted through the gate line SC, the data voltage transmitted through the data line 171 is transmitted to the gate electrode of the driving transistor T1 and then stored in the storage capacitor Cst.

The third transistor T3 (hereinafter also referred to as an initialization transistor or a sense transistor) initializes the second electrode (output side electrode) of the driving transistor T1, a second electrode of the storage capacitor Cst, and the anode of the organic light emitting diode OLED. A gate electrode of the third transistor T3 is connected with the previous gate line SS, and a first electrode thereof is connected with the initialization voltage line 173. A second electrode of the third transistor T3 is electrically connected with the second electrode (output side electrode) of the driving transistor T1, and thus, the second electrode of the third transistor T3 is connected with the anode of the organic light emitting diode OLED.

The detection signal line 173 transmits an initialization voltage INT depending on sections, or detects a voltage of the anode to which the second electrode of the third transistor T3 is connected. Thus, the third transistor T3 is also referred to as a detection transistor T3.

Hereinafter, operation of the third transistor T3 will be described. A voltage of the anode at the time of light emission of the organic light emitting diode OLED is stored in one electrode of the storage capacitor Cst. In this case, a data voltage is stored in the other electrode of the storage capacitor Cst. in this case, when a gate-on voltage is applied to the gate electrode of the third transistor T3, the detection signal line 173 operates as an initialization voltage line and thus a voltage of the anode is transmitted to a detection portion. Hereinafter, this is called a detection period. After the voltage of the anode is transmitted to the detection portion, the detection signal line 173 applies the initialization voltage Vint to the anode to initialize the voltage of the anode during the remaining period in which the gate-on voltage is applied to the gate electrode of the third transistor 13. Hereinafter, this is called an initialization period.

When a voltage detected during the detection period is determined to be different from a voltage of the anode, the data voltage may be adjusted and then applied to the pixel PX. In other words, characteristics of the driving transistor T1 may be changed, and such a change is detected to provide a proper data voltage, thereby enabling the organic light emitting diode OLED to normally emit light.

The voltage of the anode of the organic light emitting diode OLED is stored through the two capacitors Cst and Coled and then maintained during one frame.

However, according to exemplary embodiments of the present invention, a pipe other than the pixel PX shown in FIG. 20 may be used.

Figure 21:
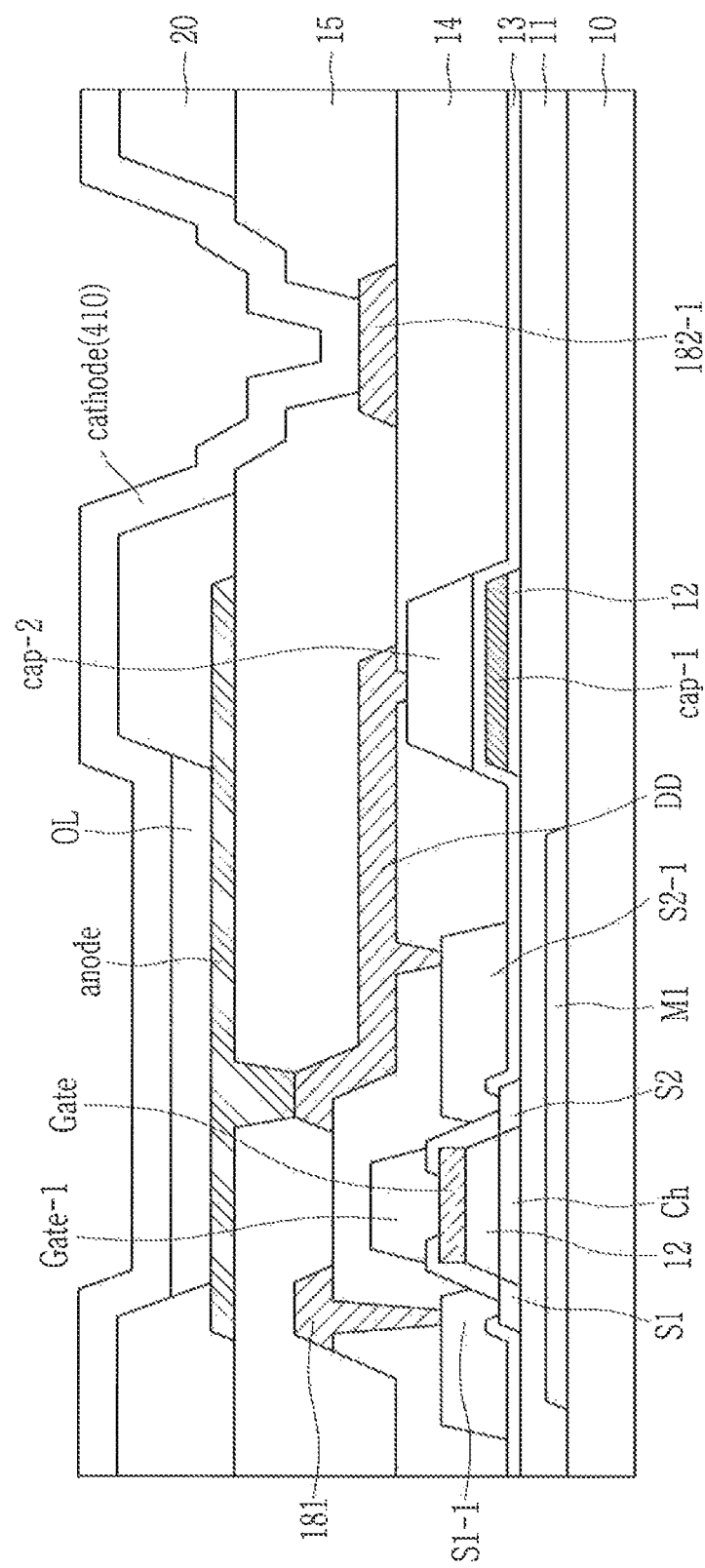
FIG. 21 and FIG. 22 are cross-sectional views of the pixel of the organic light emitting diode display according to an exemplary embodiment of the present invention.
Figure 22:
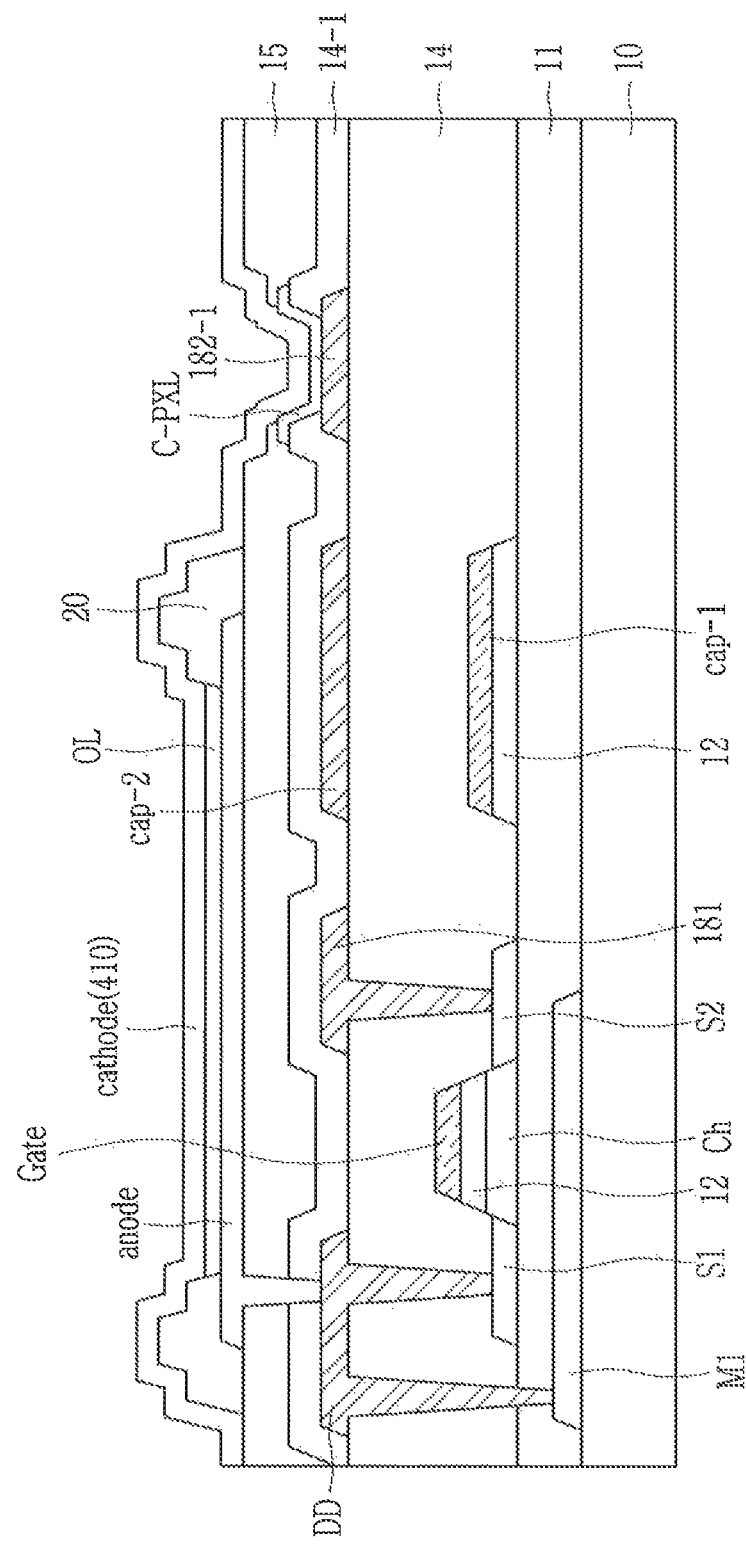

The pixel PX having a circuit structure shown in FIG. 20 may be formed with various layered structures as shown in FIG. 21 and FIG. 22.

First, a structure shown in FIG. 21 will be described.

FIG. 21 is a cross-sectional view of the organic light emitting diode display according to an exemplary embodiment of the present invention.

In the cross-sectional view of FIG. 21, the driving transistor T1, the storage capacitor Cst, and the organic light emitting diode OLED of FIG. 20 are mainly shown.

The metal layer M1 is formed on the substrate 10, and the buffer layer 11 is layered on the metal layer M1 and the substrate 10.

Semiconductor layers S1, Ch, and S2 are formed on the buffer layer 11. The semiconductor layers S1, Ch, and S2 include a first area S1, a channel area Ch, and a second area S2 of the driving transistor T1. A gate insulation layer 12 is formed on the semiconductor layers S1, Ch, and S2.

A gate conductive layer is formed on the gate insulation layer 12, and in FIG. 21, a gate electrode Gate and a. first electrode cap-1 of the storage capacitor Cst are illustrated as the gate conductive layer. The gate insulation layer 12 is disposed only below the gate electrode Gate and the first electrode cap-1 of the storage capacitor Cst.

A second gate insulation layer 13 is disposed on the gate insulation layer 12 to cover them. A second gate conductive layer is disposed on the second gate insulation layer 13, and in FIG. 21, connection electrodes S1-1, S2-1, and Gate-1, which are respectively electrically connected with the respective electrodes of the driving transistor T1, and a second electrode cap-2 of the storage capacitor Cst, are illustrated. Among the connection electrodes S1-1, S2-1, and Gate-1, an output side connection electrode S2-1 connected with the second electrode of the driving transistor T1 also electrically connected with the metal layer M1. The storage capacitor Cst is formed of the first electrode cap-1, the second electrode cap-2, and the second gate insulation layer 13 disposed between the first electrode cap-1 and the second electrode cap-2.

The second gate conductive layer is covered by an interlayer insulation layer 14.

A data conductive layer is formed on the interlayer insulation layer 14, and in FIG. 21, as the data conductive layer, a driving voltage line 181 that transmits the driving voltage ELVDD to the first electrode of the driving transistor T1, an output electrode DD of the driving transistor T1, connected with the output side connection electrode S2-1, and a peripheral driving low-voltage connection portion 182-1, disposed in the peripheral area. 120, are formed. The output electrode DD of the driving transistor T1 is also connected with the second electrode cap-2 of the storage capacitor Cst.

The data conductive layer is covered by an organic insulation layer 15. An anode is formed on the organic insulation layer 15, and is connected with the output electrode DD of the driving transistor TI and receives an output of the driving transistor T1.

A barrier rib 20 is disposed on the anode, and an organic emission layer OL is disposed on a portion of the anode, and is exposed by an opening of the barrier rib 20. A cathode 410 is disposed on the barrier rib 20 of the organic emission layer OL.

The cathode is connected with the peripheral driving low-voltage connection portion 182-1. exposed through the barrier rib 20 and an opening disposed in the organic insulation layer 15 and thus receives a driving low-voltage ELVSS.

The exemplary embodiment of the present invention shown in FIG. 21 is a structure in which a metal layer, a semiconductor layer, a gate conductive layer, a second gate conductive layer, a data conductive layer, an anode layer, and a cathode layer are layered. However, such a layered structure may be different according to exemplary embodiments of the present invention. Another exemplary embodiment of the present invention will be described with reference to FIG. 22.

FIG. 22 is a cross-sectional view of a pixel of an organic light emitting diode display according to an exemplary embodiment of the present invention.

A metal layer M1 is formed on a substrate 10, and a buffer layer 11 is layered on the metal layer M1 and the substrate 10.

Semiconductor layers S1, Ch, and S2 are formed on the buffer layer 11. The semiconductor layers S1, Ch, and S2 include a first area S1, a channel area Ch, and a second area S2 of a driving transistor T1. A gate insulation layer 12 is formed on the semiconductor layers S1, Ch, and S2.

A gate conductive layer is formed on the gate insulation layer 12, and in FIG. 22, a gate electrode Gate and a first electrode cap-1 of a storage capacitor Cst are illustrated. The gate insulation layer 12 is disposed only below the gate electrode Gate and the first electrode cap-1 of the storage capacitor Cst.

An interlayer insulation layer 14 is disposed thereon to cover the gate electrode Gate and the first electrode cap-1 of the storage capacitor Cst.

A data conductive layer is formed on the interlayer insulation layer 14, and in FIG. 22, a driving voltage line 181 for transmitting a driving voltage ELVDD to a first electrode of the driving transistor T1, an output electrode DD of the driving transistor T1, a peripheral driving low-voltage connection portion 182-1 disposed in a peripheral area 120, and a second electrode cap-2 of the storage capacitor Cst are formed. The output electrode DD of the driving transistor T1 is connected with the metal layer M1. In addition, although it is not illustrated in FIG. 22, the output electrode DD of the driving transistor T1 is electrically connected with the second electrode cap-2 of the storage capacitor Cst.

The data conductive layer may covered by a second interlayer insulation layer 14-1 (also referred to as a passivation layer). An opening that exposes the peripheral driving low-voltage connection portion 182-1 is disposed in the second interlayer insulation layer 14-1, and an interlayer low-voltage connection portion C-PXL that is electrically connected with the opened peripheral driving low-voltage connection portion 182-1 is formed on the second interlayer insulation layer 14-1. A layer formed on the second interlayer insulation layer 14-1 is called a second data conductive layer (also referred to as a pixel electrode layer in other embodiments).

An organic insulation layer 15 is formed on the second data conductive layer to cover the same. An anode is formed on the organic insulation layer 15, and the anode is connected with the output electrode DD of the driving transistor T1 and receives an output of the driving transistor T1.

A barrier rib 20 is disposed on the anode, and an organic emission layer OL is formed in a portion exposed by an opening of the barrier rib 20. A cathode 410 is disposed on the barrier rib 20 of the organic emission layer OL.

The cathode 410 is connected with the interlayer low-voltage connection portion C-PXL exposed by the barrier rib 20 and an opening, disposed in the organic insulation layer 15, and receives a driving low-voltage ELVSS from the peripheral driving low-voltage connection portion 182-1 through the interlayer low-voltage connection portion C-PXL.

The exemplary embodiment of the present invention shown in FIG. 22 is a structure in which a metal layer, a semiconductor layer, a gate conductive layer, a data conductive layer, a second data conductive layer, an anode, and a cathode are layered.

The exemplary embodiment of the present invention shown in FIG. 21 and the exemplary embodiment of the present invention shown in FIG. 22 are different from each other depending on whether or not the second gate conductive layer is included and whether or not the second data conductive layer is included.

Since the layered structure that forms each pixel PX varies as shown in FIG. 21 and FIG. 22, the structures shown in FIG. 2 to FIG. 19 may be formed of different layers, in other words, layers where the respective driving voltage wirings and the driving low-voltage wirings can be variously formed by combination of the metal layer, a gate conductive layer (including the second gate conductive layer), the data conductive layer (including the second data conductive layer), and the anode.

In accordance with an exemplary embodiment of the present invention, one gate conductive layer may include a second gate conductive layer, and the data conductive layer may include a second data conductive layer.

Exemplary embodiments of the present invention can prevent a short circuit between a driving voltage line and a driving low-voltage line that are disposed adjacent to each other in a peripheral area.

According to exemplary embodiments of the present invention, an area where pixel electrode layer that is electrically connected with the driving low-voltage line overlaps the driving voltage is reduced, thereby preventing a short circuit between the driving low-voltage line and the driving voltage line. Since a portion to which the driving low-voltage is applied and a portion to which the driving voltage is applied are disposed as far apart as possible, a short circuit between the two portions can be prevented.

While this invention has been particularly shown and described with reference to exemplary embodiments thereof, it is to be understood by those of ordinary skill in the art that various modifications may be made thereto without departing from the spirit and scope of the present invention as defined by the appended claims.

What is claimed is:

1. A display device comprising:
 a substrate;
 pixels disposed on the substrate and arranged in a first direction and a second direction perpendicular to the first direction;
 driving voltage lines including first driving voltage lines extending in the first direction and second driving voltage lines extending in the second direction and electrically connected to the first driving voltage lines;
 driving low-voltage lines including first driving low-voltage lines extending in the first direction and second driving low-voltage lines extending in the second direction and electrically connected to the first driving low-voltage lines;
 wherein the second driving low-voltage lines are disposed one for every three pixels in the first direction.

2. The display device of claim 1, wherein two or four pixels of the pixels are disposed in are area defined by adjacent two first driving low-voltage lines of the first driving low-voltage lines and adjacent two second driving low-voltage lines of the second driving low-voltage lines.

3. The display device of claim 1, wherein six pixels of the pixels are disposed in an area defined by adjacent two first driving voltage lines of the first driving voltage lines and adjacent two second driving voltage lines of the second driving voltage lines.

4. The display device of claim 1, wherein the driving voltage lines and the driving low-voltage lines form a mesh.

5. The display device of claim 1, further comprising:
 a transistor disposed on the substrate;
 an anode electrode electrically connected to the transistor;
 an emission layer disposed on the anode electrode;
 a cathode electrode disposed on the emission layer; and
 a pad electrically connected to the cathode electrode and including a conductive layer formed in a same layer as the anode electrode.

6. The display device of claim 5, further comprising:
 an organic electrode layer disposed between the transistor and the anode electrode.

7. The display device of claim 5, wherein the cathode electrode includes a portion in contact with the conductive layer.

8. The display device of claim 5, further comprising:
 a wiring portion extending in the first direction and electrically connected to the conductive layer,
 wherein the pad forms an end of the wiring portion.

9. The display device of claim 8, wherein the conductive layer electrically connects the wiring portion and the cathode electrode.

10. The display device of claim 1, further comprising:
 a transistor disposed on the substrate;
 a storage capacitor;
 an anode electrode electrically connected to the transistor;
 an emission layer disposed on the anode electrode;
 a cathode electrode disposed on the emission layer; and
 a pad electrically connected to the cathode electrode and including a conductive layer formed in a same layer as a gate electrode of the transistor.

11. The display device of claim 10, further comprising:
 a gate insulating layer disposed between a semiconductor layer of the transistor and the gate electrode.

* * * * *